United States Patent
Halasyamani et al.

(10) Patent No.: US 11,262,640 B2
(45) Date of Patent: Mar. 1, 2022

(54) NONLINEAR OPTICAL MATERIAL

(71) Applicant: University of Houston System, Houston, TX (US)

(72) Inventors: P. Shiv Halasyamani, Houston, TX (US); Hongwei Yu, Houston, TX (US); Hongping Wu, Houston, TX (US); Weiguo Zhang, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 330 days.

(21) Appl. No.: 16/492,261

(22) PCT Filed: Mar. 9, 2018

(86) PCT No.: PCT/US2018/021802
§ 371 (c)(1),
(2) Date: Sep. 9, 2019

(87) PCT Pub. No.: WO2018/165583
PCT Pub. Date: Sep. 13, 2018

(65) Prior Publication Data
US 2021/0200058 A1    Jul. 1, 2021

Related U.S. Application Data

(60) Provisional application No. 62/469,956, filed on Mar. 10, 2017.

(51) Int. Cl.
*G02F 1/355*    (2006.01)
*C01F 7/54*    (2006.01)
*C30B 29/12*    (2006.01)

(52) U.S. Cl.
CPC .............. *G02F 1/3551* (2013.01); *C01F 7/54* (2013.01); *C30B 29/12* (2013.01); *C01P 2002/20* (2013.01); *C01P 2002/60* (2013.01); *C01P 2002/80* (2013.01); *C01P 2004/61* (2013.01)

(58) Field of Classification Search
CPC .................................. G02F 1/3551; C01F 7/54
See application file for complete search history.

(56) References Cited

U.S. PATENT DOCUMENTS

2002/0000541 A1    1/2002    Sasaki et al.

FOREIGN PATENT DOCUMENTS

| CN | 103031605 A | 4/2013 |
|---|---|---|
| WO | 2007/127356 A2 | 11/2007 |

OTHER PUBLICATIONS

Ye et al. English machine translation of CN 103031605 A (Year: 2013).*

(Continued)

*Primary Examiner* — Peter F Godenschwager
(74) *Attorney, Agent, or Firm* — Conley Rose, P.C.

(57) ABSTRACT

A device comprising a nonlinear optical (NLO) material according to the formula $XLi_2Al_4B_6O_{20}F$. A device comprising a nonlinear optical material (NLO) according to the formula $KSrCO_3F$, wherein the NLO comprises at least one single crystal. A nonlinear optical material selected from the group consisting of $KSrCO_3F$ $Rb_3Ba_3Li_2Al_4B_6O_{20}F$ and $K_3Sr_3Li_2Al_4B_6O_{20}F$.

14 Claims, 14 Drawing Sheets

(56) References Cited

OTHER PUBLICATIONS

PCT/US2018/021802 International Search Report and Written Opinion dated May 8, 2018 (13 p.).

Kang, Lei et al., "Prospects for Fluoride Carbonate Nonlinear Optical Crystals in the UV and Deep-UV Regions," The Journal of Physical Chemistry, vol. 117, Nov. 18, 2013, pp. 25684-25692 (9 p.).

Wu, Hongping et al., "Deep-Ultraviolet Nonlinear-Optical Material K3Sr3Li2AI4B6O20F: Addressing the Structural Instability Problem in KBe2BO3F2," Inorganic Chemistry, vol. 56, No. 15, Jul. 25, 2017 (1 p.).

* cited by examiner

NONLINEAR OPTICAL MATERIAL

CROSS-REFERENCE TO RELATED APPLICATIONS

This application is a 35 U.S.C. § 371 national stage application of PCT/US2018/021802 filed Mar. 9, 2018, and entitled "Nonlinear Optical Material," which claims benefit of U.S. provisional patent application Ser. No. 62/469,956 filed Mar. 10, 2017, and entitled "Nonlinear Optical Material," each of which is hereby incorporated herein by reference in their entirety for all purposes.

STATEMENT REGARDING FEDERALLY SPONSORED RESEARCH OR DEVELOPMENT

This work is funded in part by the United States government, in particular by the National Science Foundation under DMR 1503573.

BACKGROUND

Nonlinear optical (NLO) materials may be employed for applications including optical switching and power limitation as well as image processing and manipulation. NLO behavior is the behavior of light in nonlinear materials where the dielectric polarization has a nonlinear response to the electric field of light applied, for example, when the electric field may be of an interatomic strength. In the field of nonlinear optical materials, a solid-state laser of a specific wavelength may be about 1064 nm (infrared), as compared to visible light which is from roughly 400 nm (blue) to 700 nm (red). The term 'solid-state laser' is used, since what is being used to lase is a Nd:YAG (neodymium-doped yttrium aluminum garnet—a solid material). When this laser light hits a NLO material, the resulting laser light is half the wavelength, i.e. 1064 nm goes in and 532 nm (green) comes out. With proper optics and a NLO crystal, a 532 nm laser may be fabricated by starting with a 1064 nm laser. This fabrication is termed second-harmonic generation (SHG)—1064 nm/2=532 nm. If another NLO crystal is disposed in front of the 532 nm light, that radiation would be halved, i.e. 532 nm/2=266 nm, or 1064 nm/4=266 nm. This is termed fourth harmonic generation (FHG). It is appreciated that the order of the harmonic generation is based on the original wavelength of 1064 nm.

Conventionally, there are commercially available materials for lasers that will go from 1064 mn to 532 nm and from 1064 nm to 266 nm. For the latter, materials such as β-BaB$_2$O$_4$ (β-BBO) and CsLiB$_6$O$_{10}$ (CLBO) are available and used in commercially available lasers. β-BBO and CLBO are the NLO crystals conventionally employed for 266 nm lasers. For example, a laser at 177.3 nm would be a sixth harmonic generation (SxHG), or 1064/6=177.3 nm. The solid-state laser that could work at 177.3 nm can be employed in photolithography and other advanced technologies. Conventionally, there has been one material that has been shown to lase at 177.3 nm-KBe$_2$BO$_3$F$_2$ (KBBF). However, KBBF has both manufacturing and application challenges issues. For example, (1) To synthesize KBBF, BeO must be employed, and BeO is highly toxic and may have restrictions on experimentation and use; (2) Even though KBBF was discovered in the late 1990's, the largest crystal grown to date is 4 mm due to the layered structure of the material; and (3) KBBF was discovered overseas and exports of the material have been constrained or halted because of its technological applications. Previously, Sr$_2$Be$_2$B$_2$O$_7$ (SBBO) was designed and synthesized, [Be$_2$B$_2$O$_7$]$_\infty$ double-layers are observed that do impart some stability, however, toxic BeO is still required in the synthesis and large single crystals have yet to be grown. In addition, β-BBO has a very high intrinsic birefringence that results in a large walk-off NLO effect that reduces the nonlinear optical properties of the material. CLBO is hygroscopic, i.e. the crystal must be kept rigorously dry or else the optical properties will deteriorate. Once a crystal of CLBO gets wet, it is no longer usable as a nonlinear optical material. If the CLBO crystal gets wet (humid air will do this) it is no longer usable as an NLO material.

Thus, an ongoing need exists for novel nonlinear optical materials and devices comprising same.

SUMMARY

Aspects described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings.

Disclosed herein is a device comprising a nonlinear optical (NLO) material according to the formula XLi$_2$Al$_4$B$_6$O$_{20}$F.

Also disclosed herein is a device comprising a nonlinear optical material (NLO) according to the formula KSrCO$_3$F, wherein the NLO comprises at least one single crystal.

Also disclosed herein is a nonlinear optical material selected from the group consisting of KSrCO$_3$F Rb$_3$Ba$_3$Li$_2$Al$_4$B$_6$O$_{20}$F and K$_3$Sr$_3$Li$_2$Al$_4$B$_6$O$_{20}$F.

DETAILED DESCRIPTION

Figure 1:
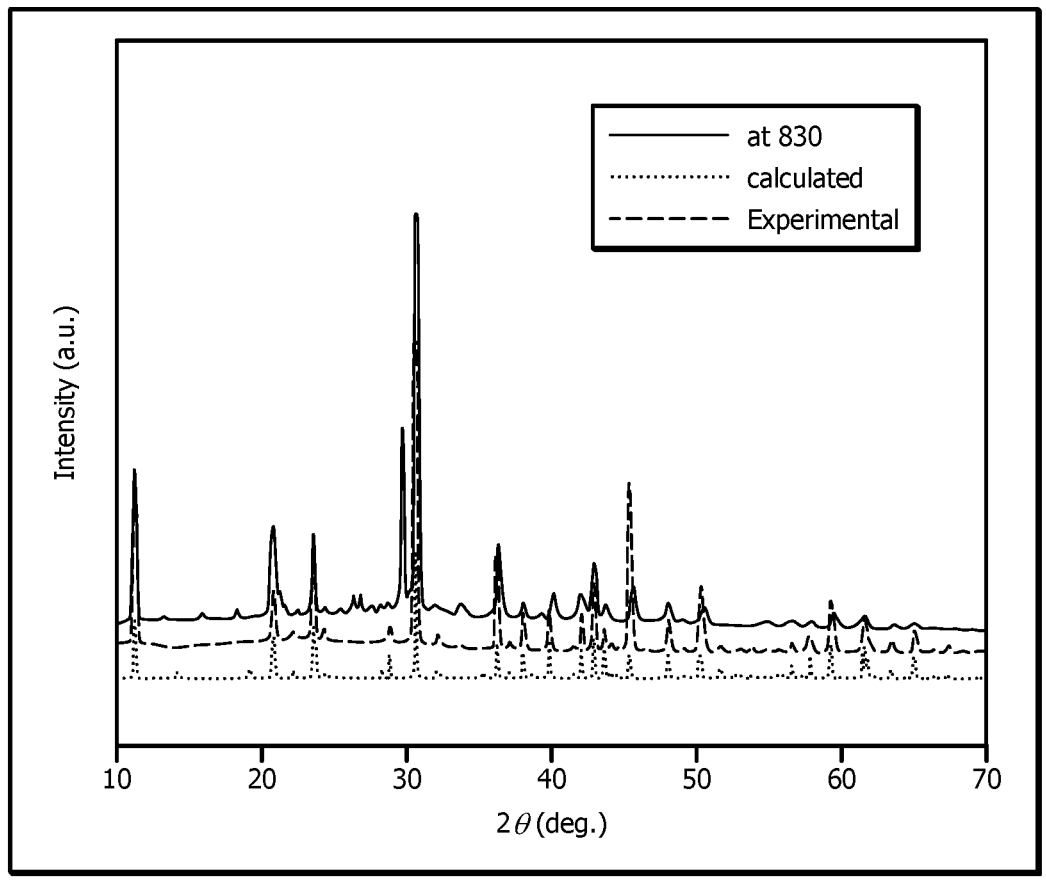
FIG. 1 is a powder x-ray diffraction (PXRD) graph of polycrystalline K$_3$Sr$_3$Li$_2$Al$_4$B$_6$O$_{20}$F fabricated according to certain aspects of the present disclosure.

The following discussion is directed to various exemplary aspects. However, one of ordinary skill in the art will understand that the examples disclosed herein have broad application, and that the discussion of any aspect is meant only to be exemplary of that aspect, and not intended to suggest that the scope of the disclosure, including the claims, is limited to that aspect.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

A "laser damage threshold" is a term used herein to define a peak fluency of laser irradiation at which irreversible changes in a material's structure may occur. This laser damage threshold may be defined as the highest quantity of laser radiation that a material may absorb before there are changes to the material's optical properties. This may also be defined by the ISO standards 21254-1, 2, 3, and 4 definitions as the highest quantity of laser radiation incident upon the optical component for which the extrapolated probability of damage is zero where the quantity of laser radiation may be expressed as power density, linear power density or energy density.

"Anisotropy" is the term used to define properties/characteristics of material that may vary depending upon the direction in which the properties/characteristics are observed/measured.

"Birefringence," which may be referred to as "double refraction," is an optical material property where a light passing through a crystal is split into two unequal wavelengths, which then each pass through the crystal at different respective speeds. Birefringence is exhibited in optically anisotropic crystals.

"Non-centrosymmetric" is a term used to describe the symmetry (or lack thereof) of certain crystal structures. Non-centrosymmetric materials are materials where point groups lack an inversion center, in contrast to centrosymmetric structures and materials which comprise a unit cell (e.g., face-centered-cubic, "fcc") that has a center of symmetry at, for example, (0,0,0). In this example, the inversion centers may be observed at atom sites such as the atom at (0, 0, ½), which would invert to the atom at (0, 0, −½), and the atom at (½, ½, 0) inverts to (−½, −½, 0). While an fcc structure comprises an inversion center at every atom, a structure may be characterized as centrosymmetric if it comprises at least one inversion center and may be characterized as non-centrosymmetric if it does not comprise any inversion centers.

"Band gap" is the characteristic of a material, such as an optical material, that is associated with the minimum energy needed to move an electron from a bound state (valence band) into a free state (conduction band). Varying energy band structures in semiconductors are associated with the electrical (including thermoelectric) properties exhibited by these semiconductors.

Disclosed herein are NLO materials and methods of making and using same. NLO materials are of intense interest owing to their ability to control and manipulate light for the generation of coherent radiation at a variety of difficult to access wavelengths. They have efficiently expanded the spectral ranges of solid state lasers from ultraviolet (UV) to infrared (IR). Accessing directly the deep-ultraviolet (DUV) region (150 nm-400 nm), however, is especially challenging, yet desirable for a number of advanced optical technologies, including photolithography for microelectronics and attosecond pulse generation for electron dynamic studies in matter.

In an aspect the NLOs of the present disclosure exhibit at least one of the following desirable characteristics: i) a noncentrosymmetric (NCS) crystal structure; ii) large SHG coefficient ($d_{ij}$>0.39 pm/V); iii) wide band gap ($E_g$>6.2 eV), i.e. an absorption edge <200 nm; iv) moderate birefringence at 1064 nm ($d_n$~0.05-0.09); v) chemical stability with a large laser damage threshold (LDT >5.0 gigawatts per $cm^2$ or $GW/cm^2$), and vi) easy growth of large—centimeter size—high quality single crystals.

In yet another aspect, NLOs of the present disclosure exhibit at least two, alternatively at least three or alternatively at least four of the following desirable characteristics: i) a noncentrosymmetric (NCS) crystal structure; ii) large SHG coefficient ($d_{ij}$>0.39 pm/V); iii) wide band gap ($E_g$>6.2 eV), i.e. an absorption edge <200 nm; iv) moderate birefringence at 1064 nm ($d_n$~0.05-0.09); v) chemical stability with a large laser damage threshold (LDT >5.0 $GW/cm^2$), and vi) easy growth of large—centimeter size—high quality single crystals.

In some aspects, the NLO materials of the present disclosure are used in UV and/or DUV applications and exhibit the following characteristics: i) a noncentrosymmetric (NCS) crystal structure; ii) large SHG coefficient ($d_{ij}$>0.39 pm/V); iii) wide band gap ($E_g$>6.2 V), i.e. an absorption edge <200 nm; iv) moderate birefringence at 1064 nm ($d_n$~0.05-0.09); v) chemical stability with a large laser damage threshold (LDT >5.0 $GW/cm^2$), and vi) easy growth of large—centimeter size—high quality single crystals.

In an aspect, the systems and methods disclosed herein produce NLO materials that have a small walk-off effect and are not hygroscopic. Herein the term "walk-off effect" refers to a material having too large a birefringence ($\Delta n$>0.11) resulting in a reduction in the intensity of the second-harmonic beam and the birefringence may be determined through refractive index measurements. An NLO material of the type disclosed herein may be characterized by a walk-off of from about 1 mrad to about 200 mrad, alternatively from about 10 mrad to about 65 mrad or alternatively from about 15 mrad to about 32 mrad. In an aspect, the NLO materials of the present disclosure comprise $KSrCO_3F$, $K_3Sr_3Li_2Al_4B_6O_{20}F$ or $Rb_3Ba_3Li_2Al_4B_6O_{20}F$, each of which are characterized by the presence of usable band gaps and birefringence.

In an aspect, the NLO materials of the present disclosure comprise $KSrCO_3F$, $K_3Sr_3Li_2Al_4B_6O_{20}F$ or $Rb_3Ba_3Li_2Al_4B_6O_{20}F$ which display (i) moderate birefringence (i.e. ~0.06) (ii) no walk-off issues (iii) are non-hygroscopic and (iv) form large, high quality single crystals. As will be understood by the ordinarily skilled artisans, large crystals are useful for technological NLO applications, and, as used herein, a "large" crystal is one that is commercially viable, in some aspects, a crystal suitable for use in the present disclosure has a minimum diameter of about 2 mm in at least two directions (e.g., the smallest dimension that is not a thickness is greater than 2 mm), alternative from about 2 mm to about 20 mm alternatively from about 3 mm to about 15 mm or alternatively from about 5 mm to about 10 mm.

In an aspect, the NLO materials of the present disclosure may form high quality crystals wherein the term "high quality" as used herein refers to a crystal that is optically clear and exhibits a full-width half-maximum (FWHM) of a Bragg reflection of <100" (arc seconds). In an aspect, the NLO materials of the present disclosure form high quality single crystals with minimum diameters in the ranges disclosed herein.

In an aspect, a NLO of the present disclosure has the general formula $XLi_2Al_4B_6O_{20}F$ wherein X comprises potassium (K) and strontium (Sr), alternatively X comprises $K_3Sr_3$. In an aspect, X comprises rubidium (Rb) and barium (Ba), alternatively, X comprises $Rb_3Ba_3$.

Disclosed herein are single crystals and methods of growing large (multi-mm) single crystals of $KSrCO_3F$, a nonlinear optical material that can generate 266 nm radiation. As noted, crystals of $KSrCO_3F$ do not suffer from walk-off issues and are not hygroscopic. It is to be appreciated that as the generation of 266 nm radiation through second-harmonic generation occurs by using large single crystals, powders would not be desirable for this purpose.

In an aspect, an NLO of the present disclosure comprises a crystal of $KSrCO_3F$. A crystal of $KSrCO_3F$ may be grown using any suitable methodology (e.g., top-seeded solution growth method) using $KF$—$Li_2CO_3$ as a flux with $SrCO_3$ The components used to prepare the NLO were used in amounts that provided a ratio of 7:10:3—$SrCO_3$:$KF$:$Li_2CO_3$ in the reaction mixture which was then heated to a temperature in the range of from about 600° C. to about 700° C. alternatively from about 615° C. to about 675° C. or alternatively from about 625° C. to about 650° C. at a heating rate of from about 25° C./hour to about 100° C./hour for a time period of from about 12 hours to about 48 hours or alternatively from about 18 hours to about 36 hours. In some aspects, NLO materials of the present disclosure may be present in amounts to provide ratios of $SrCO_3$:$KF$:$Li_2CO_3$ of from about 1 to about 10: from about 5 to about 15: from about 1 to about 10 in the reaction mixture.

In an aspect, the NLO materials disclosed herein may be used as a material for converting the wavelength of laser light. In other aspects, the NLO materials disclosed herein may be components of a device such as a laser. It should, however, be noted that the use of the NLO materials of the present disclosure is by no means limited to wavelength converting devices and it can be applied to any devices that utilize the nonlinear optical effect. Other devices than wavelength converters with which the nonlinear optical material of the present invention can be used include optical bistable devices (e.g. optical memory devices, light pulse waveform control devices, photolimiters, differential amplifiers, phototransistors, A/D converters, optical logic devices, photomultivibrators and optical flip-flop circuits), optical modulators and phase conjugated optical devices.

EXAMPLES

The disclosure having been generally described, the following examples are given as particular aspects of the disclosure and to demonstrate the practice and advantages thereof. It is understood that the examples are given by way of illustration and are not intended to limit the specification of the claims to follow in any manner.

Fabrication and Characterization of LiAlBOF-Based NLO Materials

FIG. 1 is a powder x-ray diffraction (PXRD) Polycrystalline $K_3Sr_3Li_2Al_4B_6O_{20}F$ was synthesized through solid-state methods using stoichiometric amounts of the reagents. The phase purity was confirmed by powder X-ray diffraction, the results of which are shown in FIG. 1. A single crystal of $K_3Sr_3Li_2Al_4B_6O_{20}F$ was obtained through a $Li_2O$—$SrF_2$—$B_2O_3$ flux, and its crystal structure was determined by single crystal X-ray diffraction (Table 1). $K_3Sr_3Li_2Al_4B_6O_{20}F$ crystallizes in chiral acentric trigonal space group R32 (No. 155). The $B^{3+}$ cations are coordinated to three oxygen atoms to form the $BO_3$ triangles. The $Al^{3+}$ and $Li^+$ atoms are bonded with four anions—four oxygen atoms for $Al^{3+}$ and three oxygen atoms and one fluoride for $Li^+$ to form the $AlO_4$ and $LiO_3F$ tetrahedra, respectively.

A plurality of single crystals of $K_3Sr_3Li_2Al_4B_6O_{20}F$ was grown from a high temperature solution using the flux. The $K_3Sr_3Li_2Al_4B_6O_{20}F$ crystal was grown by combining a mixture of $SrCO_3$ (0.03 mol, 4.420 g), $K_2CO_3$ (0.01-0.03 mol, 1.38-4.1463 g), $Li_2CO_3$ (0.01-0.05 mol, 0.0738-3.69 g), LiF (0.01-0.05 mol, 0.259-1.295 g), $H_3BO_3$ (0.1-0.3 mol, 6.183-18.549 g) and $Al_2O_3$ (0.04 mol, 4.078 g). The mixture was melt at 850° C. and held at this temperature for 20 h to form a homogeneous melt. The melt quickly cooled down to 750-700° C., a platinum wire was promptly dipped into melt. The temperature was further decreased to 700-650° C. at a rate of 5° C./d, then the platinum wire was pulled out of the melt and allowed to cool to room temperature at a rate of 20° C./h. Colorless, transparent crystals were grow in in this manner. Thus, a Be-free deep-ultraviolet nonlinear optical material $K_3Sr_3Li_2Al_4B_6O_{20}F$ has been successfully synthesized herein. $K_3Sr_3Li_2Al_4B_6O_{20}F$ possess a short cut-off edge, ~190 nm, and the SHG responses are 1.7×$KH_2PO_4$ and 0.3×β-$BaB_2O_4$ at 1064 and 532 nm incident radiation, respectively. The refractive indices measurement reveals a suitable birefringence of 0.0616 at 532 nm.

Reagents. $SrCO_3$ and $K_2CO_3$ (Alfa Aesar, 99.0%), $Li_2CO_3$, LiF and $H_3BO_3$ (Alfa Aesar, 99.5%), and $Al_2O_3$ (Alfa Aesar, 99.99%) were used as starting materials.

Powder X-ray Diffraction (PXRD). The purity of the samples was confirmed by powder x-ray diffraction (PXRD). PXRD was performed on a PANalytical X'Pert PRO diffractometer equipped with a diffracted-beamed monochromatic set for Cu Kα ($\lambda$=1.54056 Å) radiation. The scanning step width was 0.02° and a fixed counting time is 1 s/step from 10° to 70° in 2θ. FIG. 1 is a powder x-ray diffraction graph of the actual, experimental, and calculated PXRD patterns, which are in good agreement.

Crystal Growth. The crystals of $K_3Sr_3Li_2Al_4B_6O_{20}F$ were grown from a high temperature solution using the flux. The $K_3Sr_3Li_2Al_4B_6O_{20}F$ crystal was grown by combining a mixture of $SrCO_3$ (0.03 mol, 4.420 g), $K_2CO_3$ (0.015 mol, 2.073 g), $Li_2CO_3$ (0.025 mol, 1.845 g), LiF (0.02 mol, 0.518 g), $H_3BO_3$ (0.1 mol, 6.183 g) and $Al_2O_3$ (0.01 mol, 1.01 g). The mixture was melt at 850° C. and held at this temperature for 20 h to form a homogeneous solution. The solution quickly cooled down to 750° C., a platinum wire was promptly dipped into solution. The temperature was further decreased to 700° C. at a rate of 5° C./d, then the platinum wire was pulled out of the solution and allowed to cool to room temperature at a rate of 20° C./h. Colorless, transparent crystals that used for the seed crystal had crystallized on the platinum wire.

In another example, a plurality of large single crystals were grown by TSSG method by the $Li_2O$—$SrF_2$—$B_2O_3$ flux. The $K_3Sr_3Li_2Al_4B_6O_{20}F$ crystal was grown by combining a mixture of $SrCO_3$ (0.2 mol, 29.46 g), $K_2CO_3$ (0.075 mol, 10.37 g), $Li_2CO_3$ (0.125 mol, 9.24 g), LiF (0.1 mol, 2.59 g), $H_3BO_3$ (0.35 mol, 21.64 g) and $Al_2O_3$ (0.05 mol, 5.05 g). The mixture was melted at 850° C. and held at this temperature for 24 h to form a homogeneous solution. The solution was cooled down to 750° C. at a rate of 20° C./h. The Pt wire was dipped into the solution for 30 minutes to determine the saturation temperature. A saturation temperature of 720° C. was determined by introducing a $K_3Sr_3Li_2Al_4B_6O_{20}F$ seed crystal to the solution and holding it for 48 h. During this time the seed crystal did not grow or dissolve, and no additional crystals were formed. A $K_3Sr_3Li_2Al_4B_6O_{20}F$ seed crystal was introduced into the solution at 725° C. and held for 2 h that allowed the seed crystal surface to solution. The solution was cooled to the saturation temperature, 720° C., over 1 h. A large $K_3Sr_3Li_2Al_4B_6O_{20}F$ crystal was gown by cooling the solution at a rate of 0.2° C./d to 716° C. and the seed crystal rotates at 10 rpm that controls by a Crystal growth Furnace Lifting Structure. The crystal was pulled out of solution and cooled at a rate of 10° C./h to room temperature. The total time for crystal growth was 27 d.

Single-crystal X-ray diffraction. A colorless block crystal (0.146×0.103×0.081 $mm^3$) was selected for single-crystal diffraction analysis. Data were collected on a Bruker platform diffractometer equipped with a 4K CCD APEX II detector equipped with a diffracted-beamed graphite monochromatic set for Mo Kα radiation. For each sample, a hemisphere of data (3061 frames at 6 cm detector distance) was collected by a narrow-frame algorithm. The scan width was 0.30° in omega and the exposure time was 30 s per frame. The data including diffraction intensity, cell refinement and other related parameters were integrated using Bruker SAINT program. An empirical absorption correction was applied on the entire diffraction data. The crystal structure was solved by direct methods by the SHELXS-97 program and refined with the final least-squares program SHELXL. The PLATON program was used to check the structure, and no other higher symmetry was found. Relevant crystallographic data, selected bond distances and angles, atomic coordinates and equivalent isotropic displacement parameters for $K_3Sr_3Li_2Al_4B_6O_{20}F$ are listed in Tables 1 and 2.

TABLE 1

Crystal data and structure refinement for $Li_2K_3Sr_3Al_4B_6O_{20}F$.

| | |
|---|---|
| Empirical formula | $Li_2K_3Sr_3Al_4B_6O_{20}F$ |
| Formula weight | 905.82 |
| Temperature | 293 (2) K. |
| Wavelength | 0.71073 A |
| Crystal system, space group | Rhombohedral, R32 |
| Unit cell dimensions | a = 8.6035 (5) A |
| | b = 8.6035 (5) A |
| | c = 24.007 (3) A |
| Volume | 1538.9 (2) $Å^3$ |
| Z, Calculated density | 3, 2.932 $Mg/m^3$ |
| Absorption coefficient | 8.658 $mm^{-1}$ |
| F (000) | 1284 |
| Crystal size | 0.146 × 0.103 × 0.051 $mm^3$ |
| Theta range for data | 2.55 to 27.54 deg. |
| Limiting indices | −11 ≤ h ≤ 11, −11 ≤ k ≤ 10, −31 ≤ l ≤ 29 |
| Reflections collected/ | 3079/795 [R(int) = 0.0284] |
| Completeness to theta = | 99.80% |
| Absorption correction | Numerical |
| Max. and min. transmission | 0.7456 and 0.6013 |
| Refinement method | Full-matrix least-squares on $F^2$ |
| Data/restraints/parameters | 795/0/62 |
| Goodness-of-fit on $F^2$ | 0.908 |
| Final R indices | R1 = 0.0161, wR2 = 0.0375 |
| R indices (all data) | R1 = 0.0172, wR2 = 0.0377 |
| Absolute structure | 0.029 (8) |
| Largest diff. peak and hole | 0.286 and −0.305 e. $Å^{-3}$ |

[a] $R_1 = \Sigma||F_o| - |F_c||/\Sigma|F_o|$ and $wR_2 = [\Sigma w(F_o^2 - F_c^2)^2/\Sigma w F_o^4]^{1/2}$ for $F_o^2 > 2\sigma(F_o^2)$ Table 2 shows the Atomic coordinates (×104) and equivalent isotropic displacement parameters ($A^2×10^3$) for $Li_2K_3Sr_3Al_4B_6O_{20}F$ as well as the bond valence sum (BVS) and the U(eq), which is defined as one third of the trace of the orthogonalized Uij tensor.

TABLE 2

| Atom | x | y | z | U(eq) | BVS |
|---|---|---|---|---|---|
| Li (1) | 3333 | 6667 | 5873 (3) | 8 (2) | 1.09 |
| K (1) | 334 (1) | 3667 (1) | 6667 | 21 (1) | 0.83 |
| Sr (1) | 3594 (1) | 10000 | 5000 | 10 (1) | 1.89 |
| Al (1) | 0 | 10000 | 5922 (1) | 8 (1) | 3.11 |
| Al (2) | −3333 | 3333 | 5992 (1) | 8 (1) | 3.22 |
| B (1) | −88 (4) | 6716 (4) | 5680 (2) | 10 (1) | 2.96 |
| O (1) | −1224 (3) | 4862 (3) | 5728 (1) | 16 (1) | 2.10 |
| O (2) | −900 (2) | 7778 (3) | 5689 (1) | 13 (1) | 2.01 |
| O (3) | 1665 (3) | 7374 (2) | 5606 (1) | 21 (1) | 1.89 |
| O (4) | 0 | 10000 | 6634 (1) | 24 (1) | 2.00 |
| F (1) | 3333 | 6667 | 6667 | 21 (1) | 1.07 |

Thermal Analysis. Thermogravimetric analysis was performed on an EXSTAR TG/DTA 6300 instrument. Approximately 23 mg of $K_3Sr_3Li_2Al_4B_6O_{20}F$ were placed in a platinum pan and heated at a rate of 10° C./min from room temperature to 1200° C. under flowing N2.

Powder SHG Measurement. Powder SHG measurements were performed on a modified Kurtz-NLO system using a pulsed Nd:YAG laser (Quantel Laser, Ultra 50) with a wavelength of 1064 and 532 nm. As the powder SHG response has been shown to strongly depend on particle size, the $K_3Sr_3Li_2Al_4B_6O_{20}F$ sample was ground and sieved into distinct particle size ranges (<20, 20-45, 45-63, 63-75, 75-90, 90-125, 125-150 μm) to investigate its phase-matching behavior. Polycrystalline $KH_2PO_4$ (KDP) and β-$BaB_2O_4$ (β-BBO) were also sieved into similar particle sizes for SHG response comparison.

Figure 12:
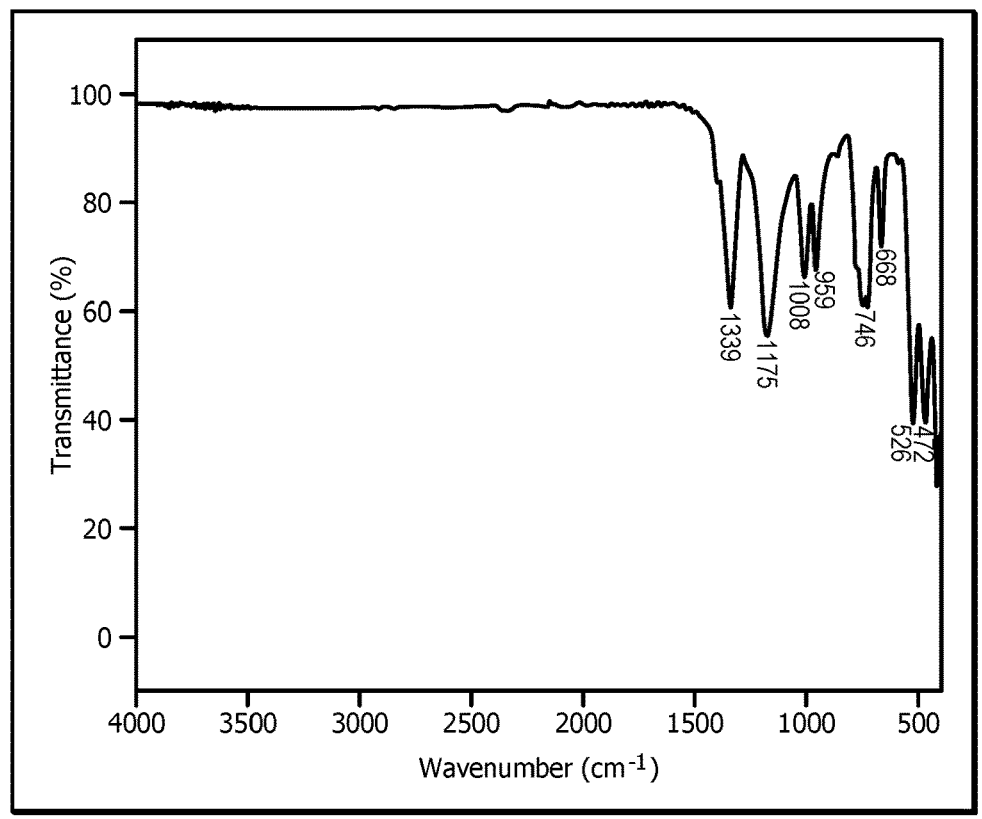
FIG. 12 illustrates a graph of the IR spectrum of $Rb_3Ba_3Li_2Al_4B_6O_{20}F$ fabricated according to certain aspects of the present disclosure.
Figure 13:
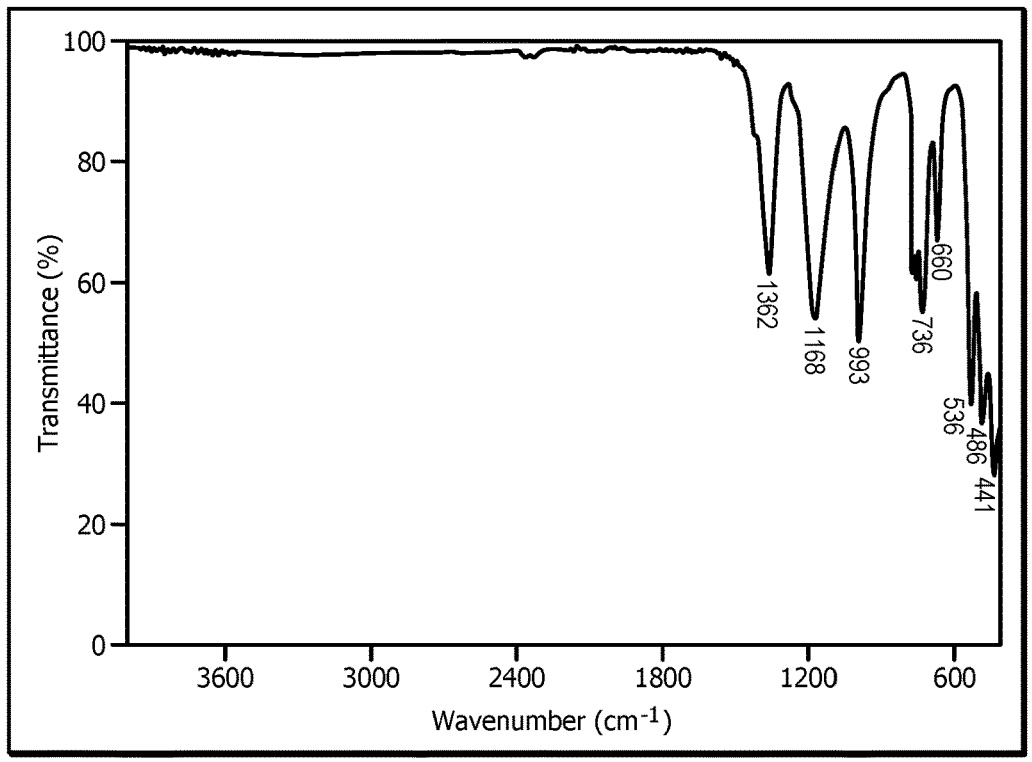
FIG. 13 is a graph of the IR Spectrum of $Li_2K_3Sr_3Al_4B_6O_{20}F$ fabricated according to certain aspects of the present disclosure.

Optical Spectra Measurement. FIG. 12 is a graph of the transmission spectrum of $K_3Sr_3Li_2Al_4B_6O_{20}F$ crystal was measured using a Shimadzu SolidSpec-3700DUV spectrophotometer from 190 to 2600 nm. A piece of (001) crystal wafer with a thickness of 1 mm was used to perform the measurement. FIG. 13 is a graph of the IR Spectrum of $Li_2K_3Sr_3Al_4B_6O_{20}F$. The infrared (IR) spectrum data of FIG. 13 was collected on a Thermo Nicolet Nexus 470 FTIR spectrometer from 400 to 4000 cm$^{-1}$. Table 6 illustrates the data associated with FIG. 13.

TABLE 6

Results from IR Spectrum of $Li_2K_3Sr_3Al_4B_6O_{20}F$.

| Mode description | Peaks (cm$^{-1}$) |
| --- | --- |
| Asymmetric stretching of B$_3$—O | 1362, 1168 |
| Symmetric stretching of B$_3$—O | 993 |
| Out-of-plane bending of B$_3$—O | 736, 660 |
| bending of B$_3$—O | 536 |
| Stretching-bending vibrations of AlO$_4$ units | 486, 441 |

Refractive Index Measurement. The refractive indices of $K_3Sr_3Li_2Al_4B_6O_{20}F$ were determined using a Metricon Model 2010/M prism coupler (Metricon Co.) at five different wavelengths: 450.2, 532, 636.5, 829.3, and 1062.6 nm. A (001) wafer was polished by the Unipol-300 grinding/polishing machine (MTI Co.) for the measurement.

Figure 2:
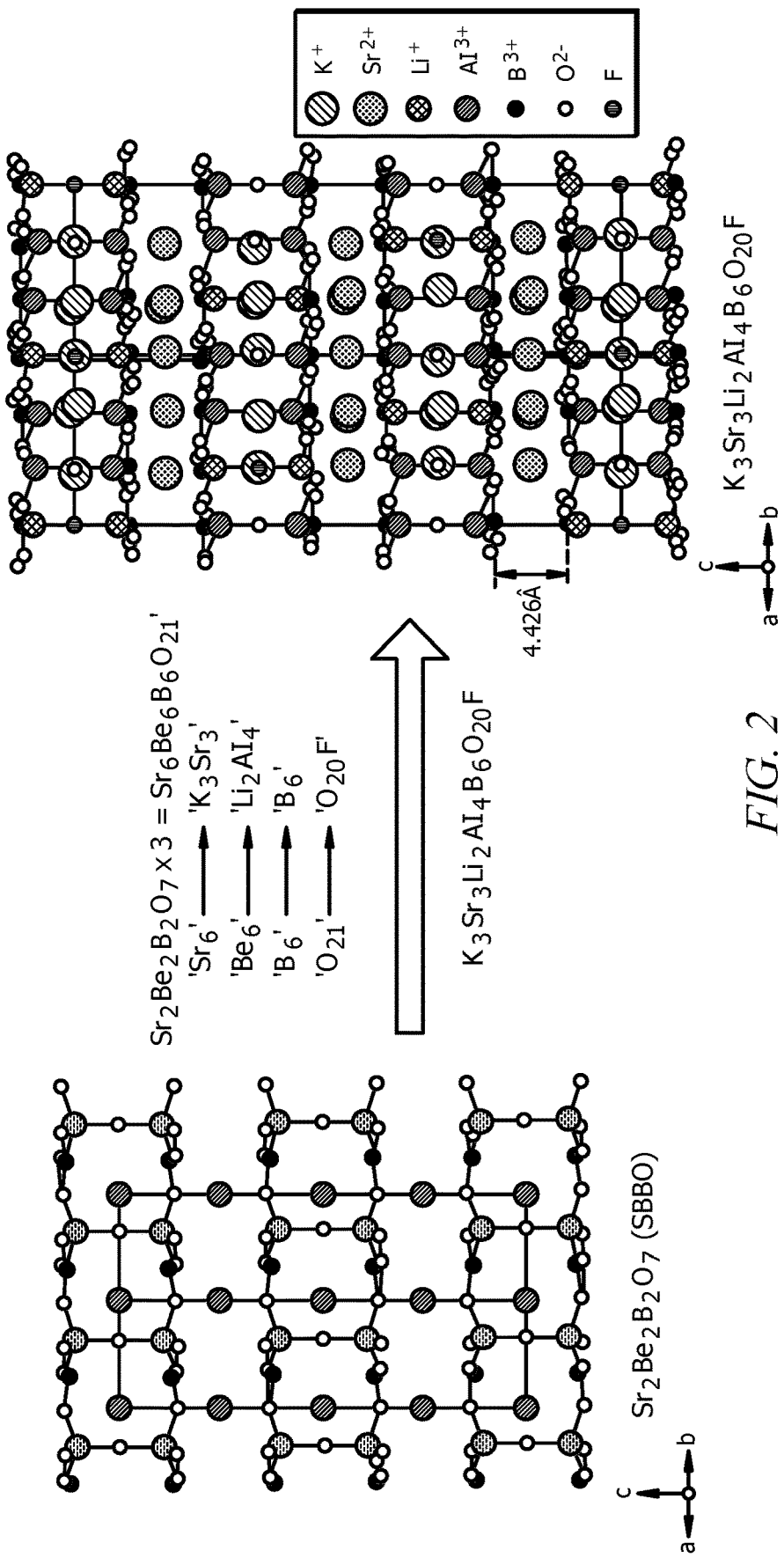
FIG. 2 is a schematic illustration of how the the AlO$_4$ and LiO$_3$F tetrahedra connect with isolated BO$_3$ triangles to create [Li$_2$Al$_4$B$_6$O$_{20}$F]$_\infty$ double-layers according to certain aspects of the present disclosure.

FIG. 2 is a schematic illustration of how the AlO$_4$ and LiO$_3$F tetrahedra connect with isolated BO$_3$ triangles to create [Li$_2$Al$_4$B$_6$O$_{20}$F]c double-layers that contain nine coordinated K$^+$ cations within the layer, and eight coordinated Sr$^{2+}$ cations between the layers. The structure may be written as $[4(AlO_{4/2})^- \ 6(BO_{3/2})^0 \ 2(LiO_{3/2}F_{1/2})^{2.5-}]^{9-}$ with charge balance retained by three K$^+$ and three Sr$^{2+}$ cations. The double-layers consist of two [LiAl$_2$B$_3$O$_6$]$_\infty$ single layers that are linked by oxygen and fluoride atoms.

Figure 3:
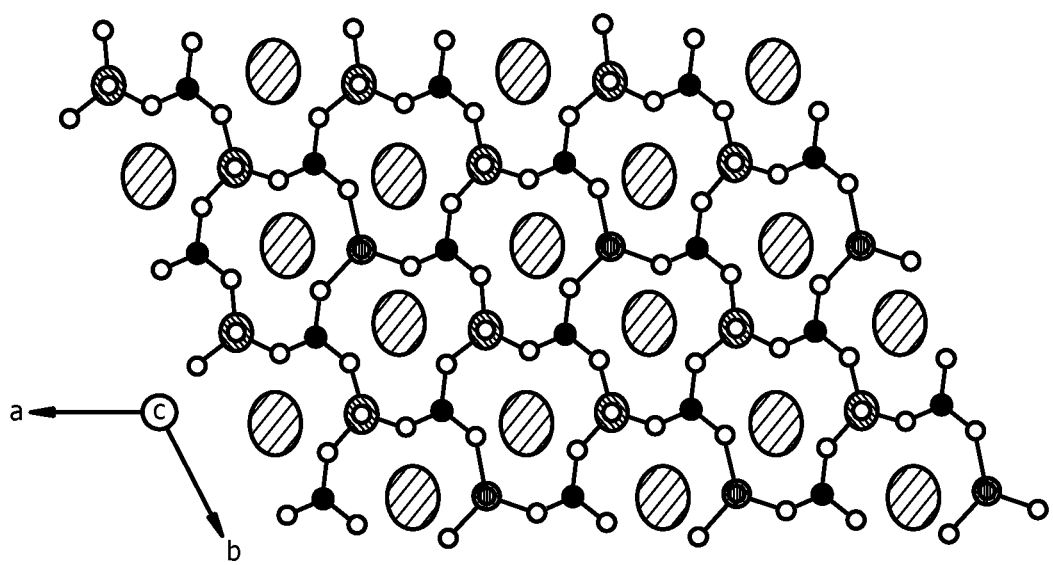
FIG. 3 is as schematic illustration of the ab-plane of an NLO material fabricated according to certain aspects of the present disclosure.

FIG. 3 is as schematic illustration of the ab-plane of an NLO material fabricated according to certain aspects of the present disclosure. As shown in FIG. 3, with respect to connectivity, the AlO$_4$ and the LiO$_3$F tetrahedra are linked to the BO$_3$ groups through oxygen forming rings wherein the K$^+$ cations reside. In addition, the reported bond lengths are consistent with those of previously reported compounds. Bond valence calculations are consistent with the reported oxidation states (see Tables 2 and 3). The IR spectrum also confirms the extence of the BO$_3$ and AlO$_4$ groups (see FIG. 12).

Table 3 shows the bond lengths [A] and angles [deg] for $Li_2K_3Sr_3Al_4B_6O_{20}F$.

TABLE 3

| | | | |
| --- | --- | --- | --- |
| Li(1)-F(1) | 1.905 (8) | F(1)-K(1)-O(2)#7 | 127.39 (3) |
| Li(1)-O(3)#1 | 1.928 (3) | O(4)#3-K(1)-O(2)#7 | 83.73 (6) |
| Li(1)-O(3)#2 | 1.928 (3) | O(4)#4-K(1)-O(2)#7 | 54.40 (6) |
| Li(1)-O(3) | 1.928 (3) | O(1)-K(1)-O(2)#7 | 66.00 (5) |
| K(1)-F(1) | 2.5808 (8) | O(1)#5-K(1)-O(2)#7 | 110.16 (6) |
| K(1)-O(4)#3 | 3.0226 (5) | O(3)#2-K(1)-O(2)#7 | 61.58 (5) |
| K(1)-O(4)#4 | 3.0226 (5) | O(3)#6-K(1)-O(2)#7 | 165.36 (6) |
| K(1)-O(1) | 3.0511 (17) | F(1)-K(1)-O(2)#8 | 127.39 (3) |
| K(1)-O(1)#5 | 3.0512 (17) | O(4)#3-K(1)-O(2)#8 | 54.40 (6) |
| K(1)-O(3)#2 | 3.099 (2) | O(4)#4-K(1)-O(2)#8 | 83.73 (6) |
| K(1)-O(3)#6 | 3.099 (2) | O(1)-K(1)-O(2)#8 | 110.15 (6) |
| K(1)-O(2)#7 | 3.1326 (18) | O(1)#5-K(1)-O(2)#8 | 66.00 (5) |
| K(1)-O(2)#8 | 3.1326 (18) | O(3)#2-K(1)-O(2)#8 | 165.37 (6) |
| Sr(1)-O(3) | 2.4948 (18) | O(3)#6-K(1)-O(2)#8 | 61.58 (5) |
| Sr(1)-O(3)#9 | 2.4948 (18) | O(2)#7-K(1)-O(2)#8 | 105.22 (7) |
| Sr(1)-O(1)#1 | 2.5500 (17) | O(3)-Sr(1)-O(3)#9 | 155.48 (9) |
| Sr(1)-O(1)#10 | 2.5500 (17) | O(3)-Sr(1)-O(1)#1 | 90.90 (7) |
| Sr(1)-O(2)#11 | 2.6010 (16) | O(3)#9-Sr(1)-O(1)#1 | 104.70 (7) |
| Sr(1)-O(2)#12 | 2.6011 (16) | O(3)-Sr(1)-O(1)#10 | 104.70 (7) |
| Sr(1)-O(3)#10 | 3.176 (2) | O(3)#9-Sr(1)-O(1)#10 | 90.89 (7) |
| Sr(1)-O(3)#1 | 3.1759 (19) | O(1)#1-Sr(1)-O(1)#10 | 101.27 (8) |

TABLE 3-continued

| | | | |
| --- | --- | --- | --- |
| Al(1)-O(4) | 1.710 (3) | O(3)-Sr(1)-O(2)#11 | 86.05 (6) |
| Al(1)-O(2) | 1.757 (2) | O(3)#9-Sr(1)-O(2)#11 | 77.48 (6) |
| Al(1)-O(2)#13 | 1.757 (2) | O(1)#1-Sr(1)-O(2)#11 | 176.22 (5) |
| Al(1)-O(2)#12 | 1.757 (2) | O(1)#10-Sr(1)-O(2)#11 | 81.68 (6) |
| Al(2)-O(4)#3 | 1.698 (3) | O(3)-Sr(1)-O(2)#12 | 77.48 (6) |
| Al(2)-O(1)#7 | 1.742 (2) | O(3)#9-Sr(1)-O(2)#12 | 86.05 (6) |
| Al(2)-O(1) | 1.742 (2) | O(1)#1-Sr(1)-O(2)#12 | 81.68 (6) |
| Al(2)-O(1)#14 | 1.743 (2) | O(1)#10-Sr(1)-O(2)#12 | 176.22 (5) |
| B(1)-O(3) | 1.332 (3) | O(2)#11-Sr(1)-O(2)#12 | 95.48 (8) |
| B(1)-O(1) | 1.398 (4) | O(3)-Sr(1)-O(3)#10 | 137.99 (2) |
| B(1)-O(2) | 1.401 (3) | O(3)#9-Sr(1)-O(3)#10 | 66.18 (8) |
| F(1)-Li(1)-O(3)#1 | 109.5 (2) | O(1)#1-Sr(1)-O(3)#10 | 70.59 (5) |
| F(1)-Li(1)-O(3)#2 | 109.5 (2) | O(1)#10-Sr(1)-O(3)#10 | 47.11 (6) |
| O(3)#1-Li(1)-O(3)#2 | 109.5 (2) | O(2)#11-Sr(1)-O(3)#10 | 113.18 (5) |
| F(1)-Li(1)-O(3) | 109.5 (2) | O(2)#12-Sr(1)-O(3)#10 | 132.87 (5) |
| O(3)#1-Li(1)-O(3) | 109.5 (2) | O(3)-Sr(1)-O(3)#1 | 66.18 (8) |
| O(3)#2-Li(1)-O(3) | 109.5 (2) | O(3)#9-Sr(1)-O(3)#1 | 137.99 (2) |
| F(1)-K(1)-O(4)#3 | 124.706 (13) | O(1)#1-Sr(1)-O(3)#1 | 47.11 (6) |
| F(1)-K(1)-O(4)#4 | 124.705 (13) | O(1)#10-Sr(1)-O(3)#1 | 70.59 (5) |
| O(4)#3-K(1)-O(4)#4 | 110.59 (3) | O(2)#11-Sr(1)-O(3)#1 | 132.87 (5) |
| F(1)-K(1)-O(1) | 92.93 (5) | O(2)#12-Sr(1)-O(3)#1 | 113.18 (5) |
| O(4)#3-K(1)-O(1) | 55.77 (6) | O(3)#10-Sr(1)-O(3)#1 | 74.03 (7) |
| O(4)#4-K(1)-O(1) | 120.29 (6) | O(4)-Al(1)-O(2) | 108.56 (7) |
| F(1)-K(1)-O(1)#5 | 92.93 (5) | O(4)-Al(1)-O(2)#13 | 108.57 (7) |
| O(4)#3-K(1)-O(1)#5 | 120.29 (6) | O(2)-Al(1)-O(2)#13 | 110.36 (7) |
| O(4)#4-K(1)-O(1)#5 | 55.77 (6) | O(4)-Al(1)-O(2)#12 | 108.57 (7) |
| O(1)-K(1)-O(1)#5 | 174.14 (9) | O(2)-Al(1)-O(2)#12 | 110.36 (7) |
| F(1)-K(1)-O(3)#2 | 66.12 (4) | O(2)#13-Al(1)-O(2)#12 | 110.36 (7) |
| O(4)#3-K(1)-O(3)#2 | 125.53 (7) | O(4)#3-Al(2)-O(1)#7 | 111.30 (8) |
| O(4)#4-K(1)-O(3)#2 | 83.10 (6) | O(4)#3-Al(2)-O(1) | 111.29 (8) |
| O(1)-K(1)-O(3)#2 | 71.54 (5) | O(1)#7-Al(2)-O(1) | 107.59 (8) |
| O(1)#5-K(1)-O(3)#2 | 110.98 (5) | O(4)#3-Al(2)-O(1)#14 | 111.30 (8) |
| F(1)-K(1)-O(3)#6 | 66.12 (4) | O(1)#7-Al(2)-O(1)#14 | 107.59 (8) |
| O(4)#3-K(1)-O(3)#6 | 83.10 (6) | O(1)-Al(2)-O(1)#14 | 107.59 (8) |
| O(4)#4-K(1)-O(3)#6 | 125.52 (7) | O(3)-B(1)-O(1) | 119.5 (2) |
| O(1)-K(1)-O(3)#6 | 110.98 (5) | O(3)-B(1)-O(2) | 123.6 (2) |
| O(1)#5-K(1)-O(3)#6 | 71.54 (5) | O(1)-B(1)-O(2) | 116.8 (2) |
| O(3)#2-K(1)-O(3)#6 | 132.24 (8) | | |

Symmetry transformations used to generate equivalent atoms for Table 3: #1 −x+y,−x+1,z; #2 −y+1,x−y+1,z; #3 y−4/3,x+⅓,−z+4/3; #4 x,y−1,z; #5 y−⅓,x+⅓,−z+4/3; #6 x−y+⅔,−y+4/3,−z+4/3; #7 −x+y−1,−x,z; #8 −x−⅓,−x+y−⅔,−z+4/3; #9 x−y+1,−y+2,−z+1; #10 y,x+1,−z+1; #11 −x,−x+y,−z+1; #12 −y+1,x−y+2,z; #13 −x+y−1,−x+1,z; #14 −y,x−y+1,z; #15 x,y+1,z #16 x−1,y−1,z; #17 y−⅓,x+4/3,−z+4/3.

Three structural features are evident in $K_3Sr_3Li_2Al_4B_6O_{20}F$. First, the BO$_3$ groups exhibit a coplanar configuration that favors a large (d$_{ij}$>0.39 pm/V) SHG response and moderate birefringence (e.g., d$_n$=0.05-0.09). Second, the oxygen atoms on the BO$_3$ groups are fully bonded, i.e. there are no dangling oxygen bonds, and, thus, a short absorption edge is observed. Third, the remaining Al—O and Li—F bonds connect the [LiAl$_2$B$_3$O$_6$]$_\infty$ layer to create the double layers that generate stability and facilitate crystal growth. Before delving into the crystal growth and associated properties, a discussion on the powder SHG efficiency, thermal and moisture stabilities is desirable.

Figure 4A:
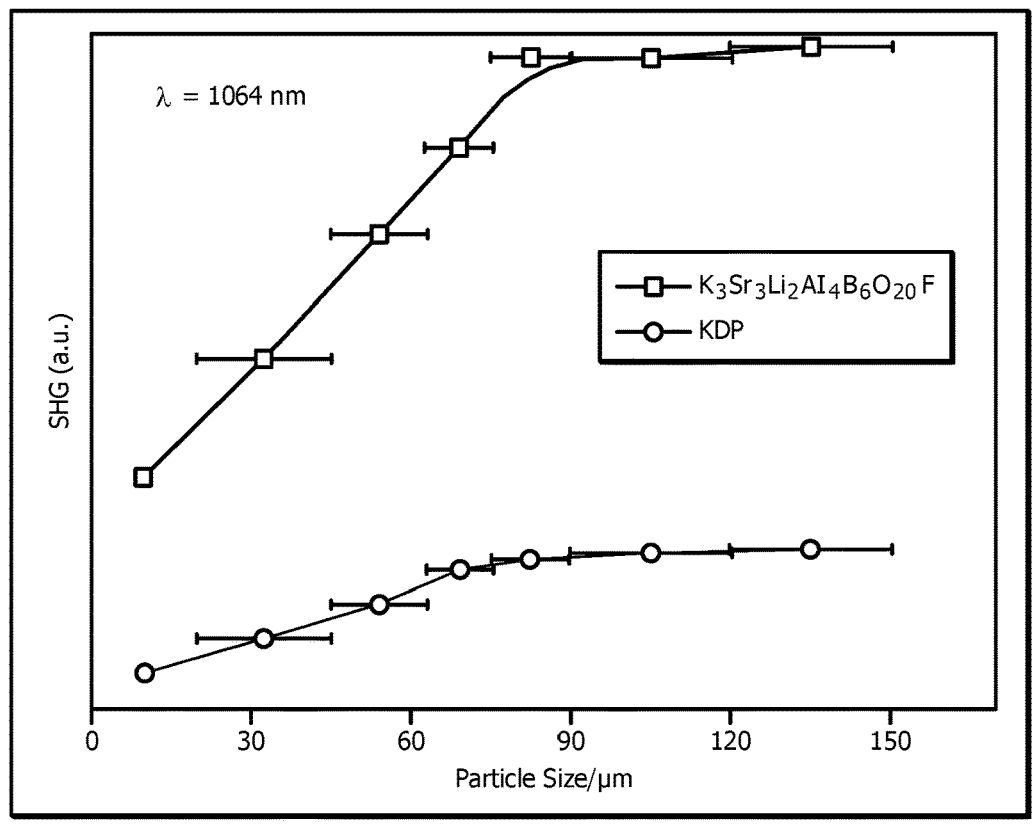
FIGS. 4A and 4B are graphs of the powder SHG results for K$_3$Sr$_3$Li$_2$Al$_4$B$_6$O$_{20}$F fabricated according to aspects of the present disclosure.
Figure 4B:
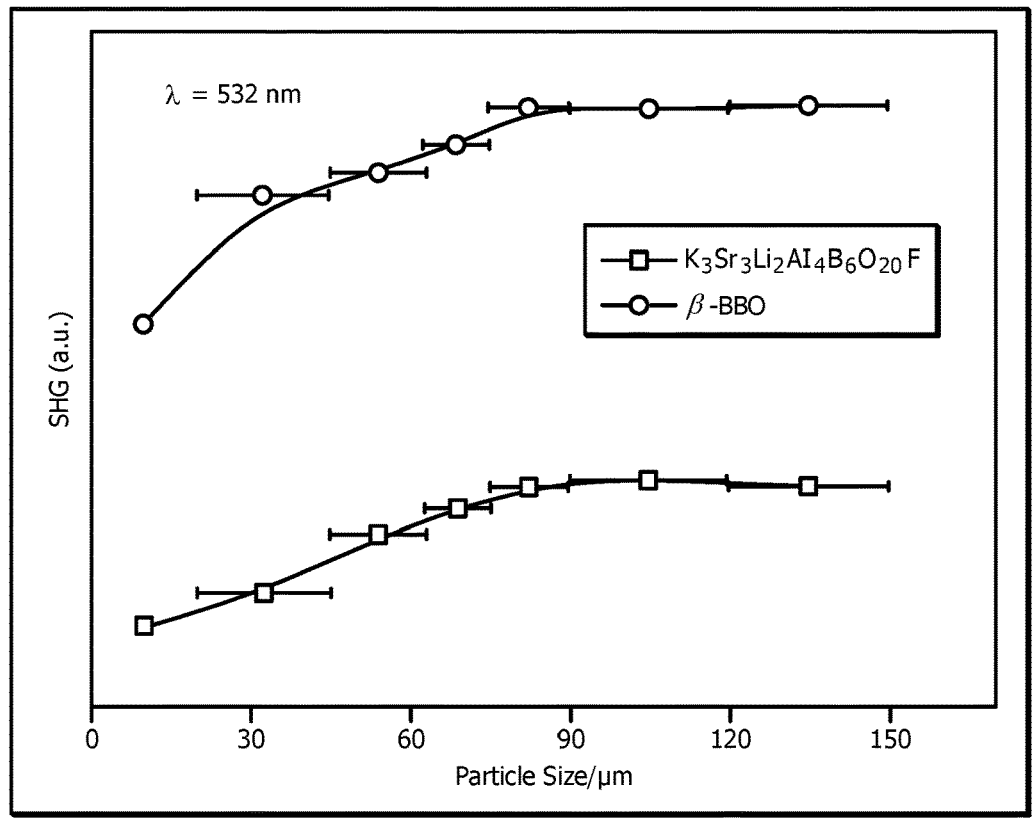
Figure 14:
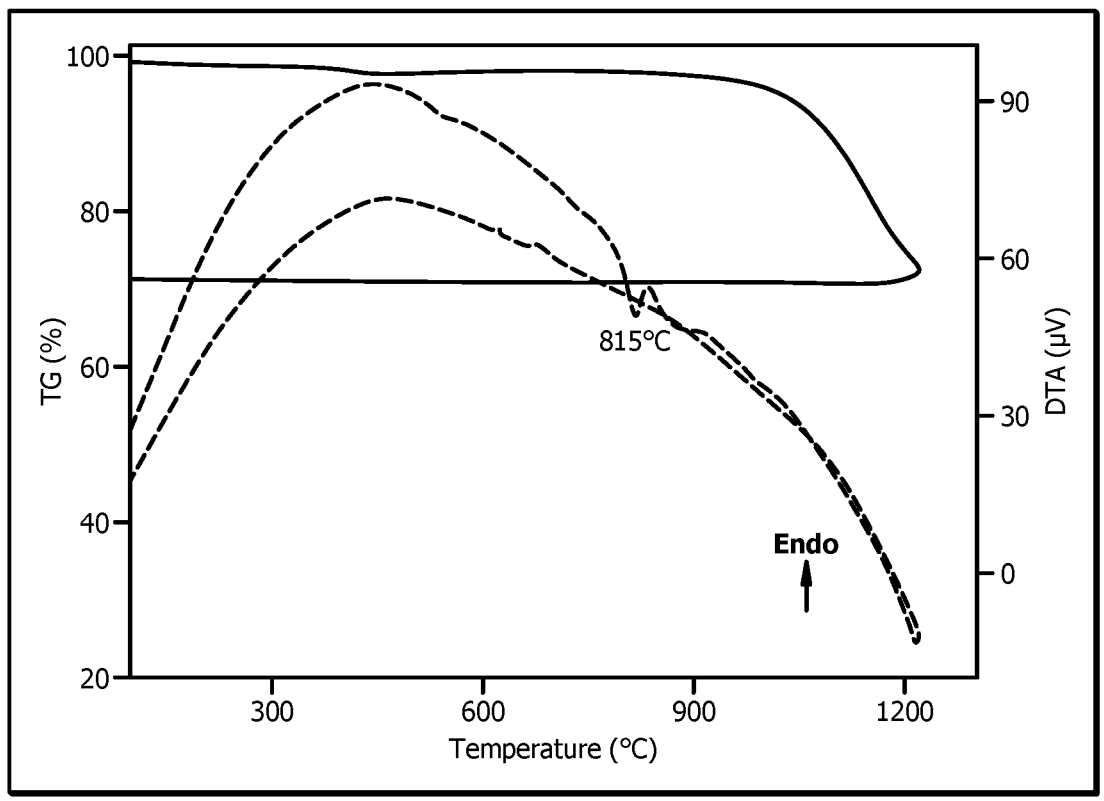
FIG. 14 is a graph of the TG/DTA data for $Li_2K_3Sr_3Al_4B_6O_{20}F$ fabricated according to certain aspects of the present disclosure.

FIGS. 4A and 4B are graphs of the powder SHG results for $K_3Sr_3Li_2Al_4B_6O_{20}F$ fabricated according to aspects of the present disclosure. The powder SHG efficiencies, as a function of particle size, was measured at 1064 nm (FIG. 4A) and 532 nm (FIG. 4B). It is clear that the SHG intensities increase with the increasing of particle sizes for both wavelengths indicating that $K_3Sr_3Li_2Al_4B_6O_{20}F$ is phase-matchable at both wavelengths, consistent with the phase-matching calculations based on experimental refractive index data. The SHG efficienes of $K_3Sr_3Li_2Al_4B_6O_{20}F$ at 1064 nm and 532 nm are approximately 1.7×KDP and 0.3×β-BBO respectively, in the 125-150 μm particle size range. Thermal analysis and moisture stability experiments were also performed. FIG. 14 is a graph of the TG/DTA data for $Li_2K_3Sr_3Al_4B_6O_{20}F$. FIG. 14 indicates an endothermic peak around 812° C. Above 812° C., $K_3Sr_3Li_2Al_4B_6O_{20}F$ decomposes to $K_2Al_2B_2O_7$ and other unknown phases. With respect to moisture stability, a 0.1930 g crystal of $K_3Sr_3Li_2Al_4B_6O_{20}F$ was submerged in water for one week. After one week the crystal was removed from the water and reweighed.

Figure 5:
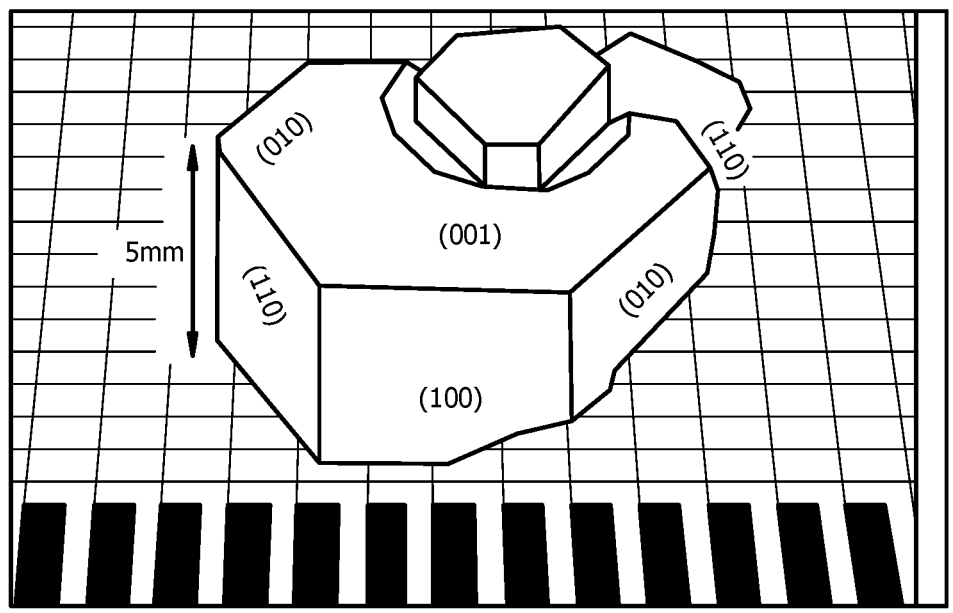
FIG. 5 is an indexed single crystal of K$_3$Sr$_3$Li$_2$Al$_4$B$_6$O$_{20}$F fabricated according to aspects of the present disclosure.

FIG. 5 is a photograph of an indexed single crystal of $K_3Sr_3Li_2Al_4B_6O_{20}F$. Large single crystals of $K_3Sr_3Li_2Al_4B_6O_{20}F$ were grown by the top seeded-solution growth (TSSG) technique discussed herein. Based on Bravais-Friedel-Donnay-Harker (BFDH) theory, the calculated morphology of FIG. 5 is consistent with that of the grown crystal. One issue with KBBF and SBBO is the tendency to layer along the optic axis, i.e. the c-axis, that hinders large crystal growth. As seen in FIG. 5, the crystal dimension along the c-axis is 5 mm that suggests the short double-layer distance in $K_3Sr_3Li_2Al_4B_6O_{20}F$ favors large crystal growth.

Figure 6:
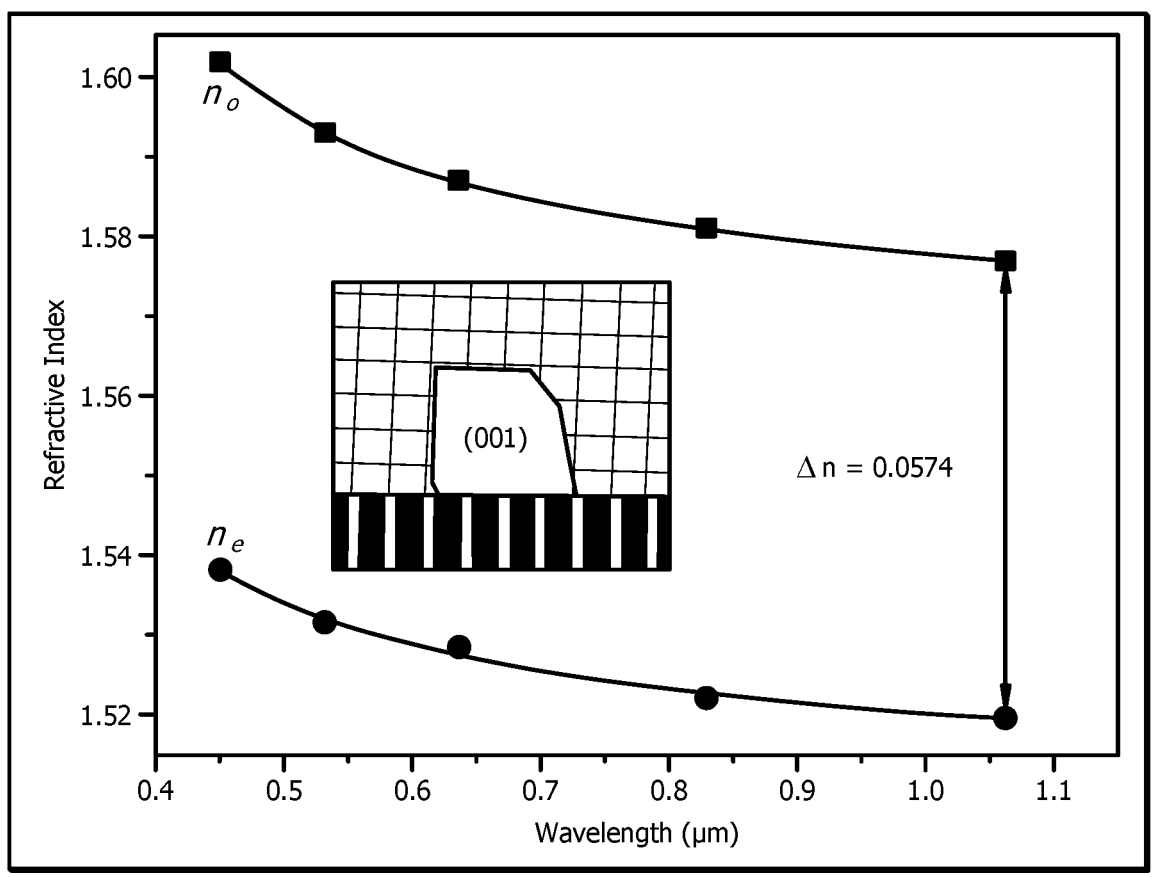
FIG. 6 is a graph of the refractive-index for a wafer of K$_3$Sr$_3$Li$_2$Al$_4$B$_6$O$_{20}$F that was manufactured according to certain aspects of the present disclosure.

FIG. 6 is a graph of the refractive-index for a wafer of $K_3Sr_3Li_2Al_4B_6O_{20}F$ that was manufactured according to certain aspects of the present disclosure. The sample, shown in the inset in FIG. 6, was cut and polished to obtain the optical measurements in FIG. 6. The transmission spectrum of $K_3Sr_3Li_2Al_4B_6O_{20}F$ was collected on a 1 mm thick crystal at room temperature (see experimental section).

Figure 16:
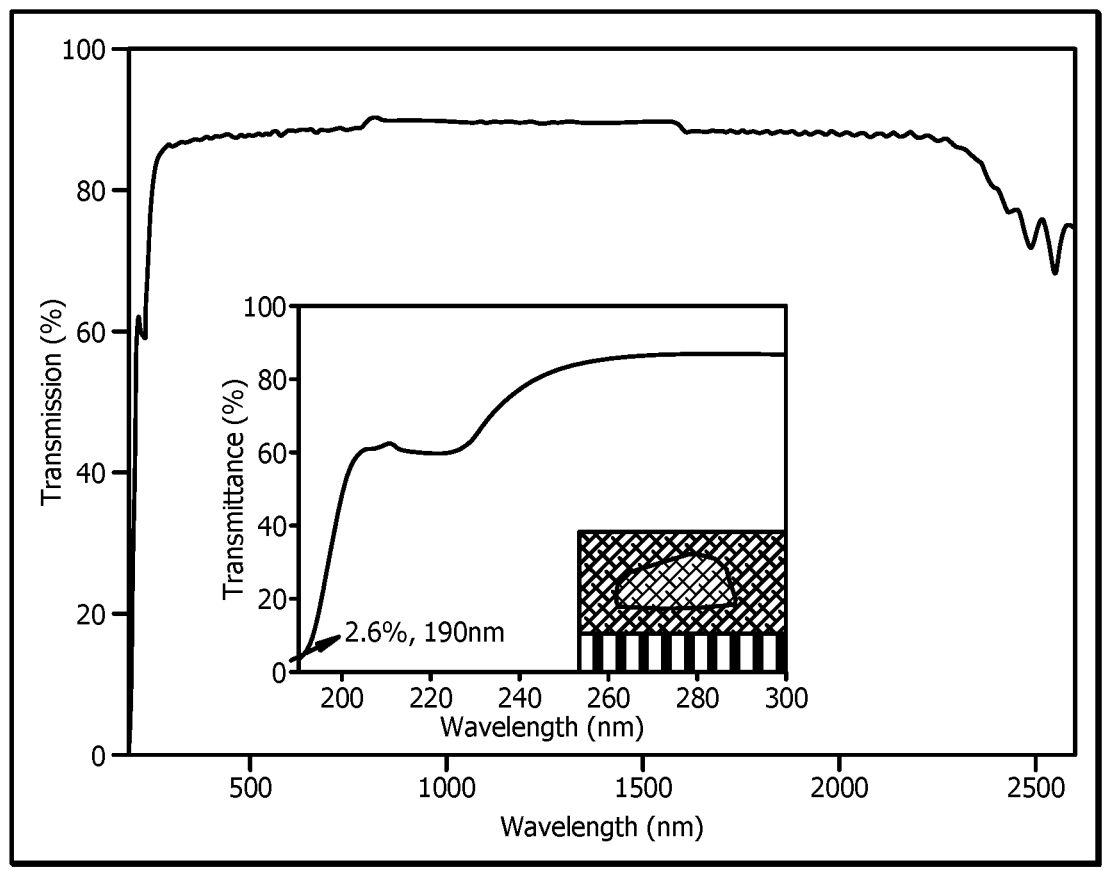
FIG. 16 is a graph of transmission and wavelength for $K_3Sr_3Li_2Al_4B_6O_{20}F$ fabricated according to certain aspects of the present disclosure.

FIG. 16 is a graph of transmission and wavelength for $K_3Sr_3Li_2Al_4B_6O_{20}F$ fabricated according to certain aspects of the present disclosure. An absorption edge of 190 nm was determined, as is shown in FIG. 16. The refractive index was measured at at five wavelengths –450.2, 532, 636.5, 829.3, and 1062.2 nm, using the prism coupling technique, in order to determine the birefringence. A (001) crystal wafer was polished for the measurements, as shown in the inset in FIG. 6. As $n_o > n_e$, $K_3Sr_3Li_2Al_4B_6O_{20}F$ may be considered a negative uniaxial crystal, with the birefringence ($\Delta n = n_o - n_e$) ranging from 0.0574-0.0637 over the measured wavelength range. The Sellmeier equation, $n_i^2 = A + B/(\lambda^2 - C) - D\lambda^2$, can be fit to the measured refractive index data. The calculated and experimental refractive indices and Sellmeier coefficients are given (Tables 4 and 5). The data in Tables 4 and 5 enables the determination of the birefreingence. This data is fitted using the Sellmeier quations, which are the curves in FIG. 6, and is used to determine the phase-matching wavelength range in FIG. 7.

TABLE 4

Experimental and calculated refractive indices for $K_3Sr_3Li_2Al_4B_6O_{20}F$.

| | $n_o$ | | $n_e$ | | |
|---|---|---|---|---|---|
| λ/μm | Exp. | Calc. | Exp. | Calc. | $\Delta n = n_o - n_e$ |
| 0.4502 | 1.6020 | 1.6020 | 1.5383 | 1.5382 | 0.0637 |
| 0.5320 | 1.5931 | 1.5932 | 1.5315 | 1.5321 | 0.0616 |
| 0.6365 | 1.5872 | 1.5870 | 1.5283 | 1.5275 | 0.0589 |
| 0.8293 | 1.5809 | 1.5810 | 1.5222 | 1.5227 | 0.0587 |
| 1.0626 | 1.5771 | 1.5771 | 1.5197 | 1.5196 | 0.0574 |

TABLE 5

Sellmeier coefficients derived from the measured refractive indices.

| | A | B | C | D |
|---|---|---|---|---|
| $n_o$ | 2.48387 | 0.01414 | 0.03468 | 0.00855 |
| $n_e$ | 2.30376 | 0.01268 | 0.00212 | 0.00525 |

Figure 7:
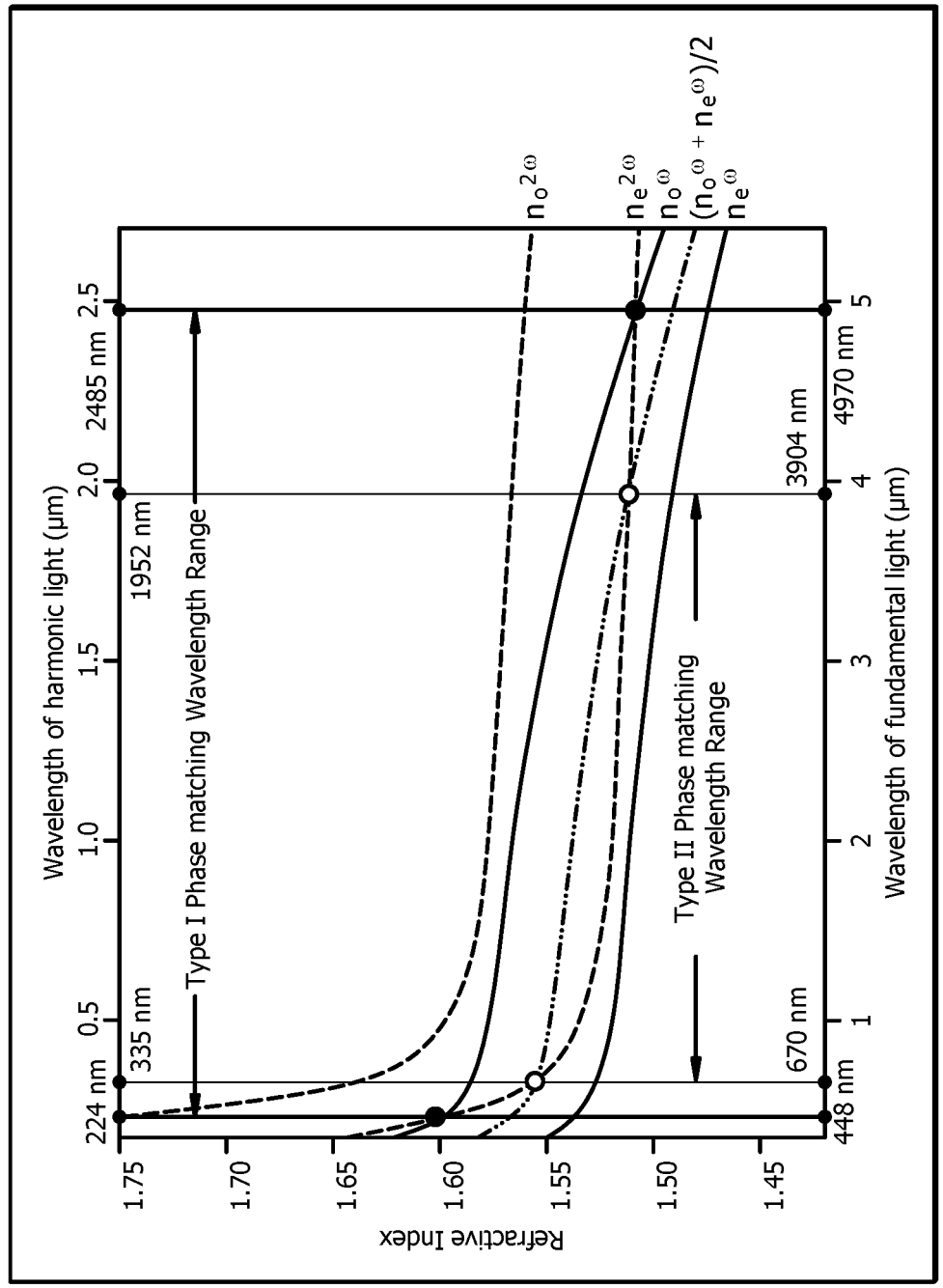
FIG. 7 is a graph of the calculated refractive index dispersion curves, based on the Sellmeier equations, for the samples of K$_3$Sr$_3$Li$_2$Al$_4$B$_6$O$_{20}$F manufactured according to certain aspects of the present disclosure.

FIG. 7 is a graph of the calculated refractive index dispersion curves, based on the Sellmeier equations, for the samples of $K_3Sr_3Li_2Al_4B_6O_{20}F$ manufactured according to certain aspects of the present disclosure. The red solid and green dashed lines represent the calculated refractive indices for the fundamental and second harmonic wavelengths, i.e. $n(\omega)$ and $n(2\omega)$, whereas the blue dashed line represents $(n_o(\omega) + n_e(\omega))/2$. Type I phase-matching occurs when $n(\omega) = n(2\omega)$, or in FIG. 7 when the red solid line crosses the green dashed line. This is indicated by black circles. By drawing vertical lines from these black circles to the upper and lower x-axes, the type I phase-matching wavelength range was determined. $K_3Sr_3Li_2Al_4B_6O_{20}F$ is type I phase-matchable for fundamental (second-harmonic) radiation from 448-4970 nm (224-2485 nm). Type II phase-matching occurs when $(n_o(\omega) + n_e(\omega))/2 = n_e(2\omega)$, i.e. the blue circles in FIG. 7. Similar to the type I phase-matching wavelength range, the type II phase-matching range was determined by drawing vertical lines from the blue circles to the upper and lower x-axes. The type II phase-matching wavelength range for fundamental (second-harmonic) radiation is 670-3904 nm (335-1952 nm). Thus, the SHG limit for $K_3Sr_3Li_2Al_4B_6O_{20}F$ is 224 nm, indicating that the material can achieve FHG and produce 266 nm light from 1064 nm laser. As such, $K_3Sr_3Li_2Al_4B_6O_{20}F$ may be a viable replacement for $\beta$-$BaB_2O_4$ and $CsLiB_6O_{10}$.

Addressing the layering tendency of NLO $KBe_2BO_3F_2$ (KBBF) and $Sr_2Be_2B_2O_7$ (SBBO), large crystals of $K_3Sr_3Li_2Al_4B_6O_{20}F$ were fabricated. The NLO active material exhibits an absorption edge of 190 nm, and is SHG active at 1064 nm and 532 nm. Large single crystals were grown using the top-seeded solution growth method. Optical measurements on these crystals revealed a moderate birefringence of 0.0574 at 1064 nm. Calculations indicate a Type I phase-matching wavelength behavior for fundamental (second-harmonic) radiation between 448-4970 nm (224-2485 nm) indicating that $K_3Sr_3Li_2Al_4B_6O_{20}F$ is a viable material to generate 266 nm by FHG.

$Rb_3Ba_3Li_2Al_4B_6O_{20}F$ crystals were grown by the top seed solution growth (TSSG) method according to certain aspects of the present disclosure. Some small $Rb_3Ba_3Li_2Al_4B_6O_{20}F$ crystals with regular shape were picked from the crystals obtained by the above method and were used as seed crystals. And then a clear and homogeneous solution was prepared by using the same program as given above. A relatively large seed was attached to the platinum rod and was soaked in the solution. By observing the growth or dissolution of the seed, a saturation temperature of 712° C. was determined. Then a high quality $Rb_3Ba_3Li_2Al_4B_6O_{20}F$ seed was dipped into the surface of the solution at 10° C. higher than the saturation temperature. This was followed by decreasing the temperature to the saturation point over 40 min. From this temperature, the solution was cooled at a rate of 0.25° C. per day. After the desired crystal size was obtained, the $Rb_3Ba_3Li_2Al_4B_6O_{20}F$ crystal was pulled out of the solution and cooled to room temperature at a rate of 10° C./h.

A crystal of KSrCO$_3$F was grown by the top-seeded solution growth method using KF—Li$_2$CO$_3$ as a flux. KF, SrCO$_3$, and Li$_2$CO$_3$ with a molar ratio 10:7:3 were placed in an alumina crucible, heated to 630° C. at a heating rate of 100° C./h and held for 50 h in order to form a homogenous melt. Crystals of KSrCO$_3$F were first grown by spontaneous crystallization, i.e. crystals formed on an alumina rod dipped into the melt. Seed crystals were selected from these spontaneously grown crystals. A crystallization temperature of 611° C. was determined by observing the growth or dissolution of the seed crystals when dipped into the melt. An oriented seed crystal was introduced into the melt at a rotation rate of 5 rpm at 2° C. higher than the crystallization temperature of 611° C. in order to reduce surface defects of the seed. The temperature was decreased to the crystallization temperature at a cooling rate of 0.5° C./min. From the crystallization temperature, the melt was cooled at a rate of 0.5° C. per day to 590° C. When the crystal growth process was done, i.e. by observing the gap between the growing crystal and the crucible wall (when the crystal edge is very close to the crucible wall the crystal growth is considered completed), the crystal was pulled from the melt and cooled (20° C./h) to room temperature. In the above manner, high quality and large single crystals of KSrCO$_3$F can be grown for nonlinear optical applications.

Synthesis. Polycrystalline Rb$_3$Ba$_3$Li$_2$Al$_4$B$_6$O$_{20}$F was synthesized by conventional solid-state methods. Stoichiometric amount of Rb$_2$CO$_3$ (Alfa Aesar, 99%), BaCO$_3$ (Alfa Aesar, 99.8%) and BaF$_2$ (Alfa Aesar, 99%) Li$_2$CO$_3$ (Alfa Aesar, 99.0%), Al$_2$O$_3$ (Alfa Aesar, 99.997%), H$_3$BO$_3$ (Alfa Aesar, 99.8%) were ground thoroughly and pressed into pellet. The pellet was placed on a platinum plate and heated to 300° C. for 20 h to decompose carbonates and H$_3$BO$_3$, and then the temperature was raised to 630° C., held for 5 days, with several intermittent grindings. Laboratory powder x-ray diffraction indicated pure Rb$_3$Ba$_3$Li$_2$Al$_4$B$_6$O$_{20}$F was obtained, FIG. 12 illustrates a graph of the IR spectrum of Rb$_3$Ba$_3$Li$_2$Al$_4$B$_6$O$_{20}$F fabricated according to certain aspects of the present disclosure.

Crystal Growth. The centimeter-size Rb$_3$Ba$_3$Li$_2$Al$_4$B$_6$O$_{20}$F crystal was grown by TSSG method with Li$_2$O—BaF$_2$—B$_2$O$_3$. The seed was obtained by recrystallize the Stoichiometric amount of Rb$_3$Ba$_3$Li$_2$Al$_4$B$_6$O$_{20}$F melts. Then a clear and homogeneous solution was prepared by using melt Rb$_3$Ba$_3$Li$_2$Al$_4$B$_6$O$_{20}$F and flux at molar ratio Rb$_3$Ba$_3$Li$_2$Al$_4$B$_6$O$_{20}$F:Li$_2$O:BaF$_2$:B$_2$O$_3$=1:4:3:5 at 750° C. for 10 h. A relatively large seed was attached to the platinum rod and was soaked in the solution. By observing the growth or dissolution of the seed, a saturation temperature of 712° C. was determined. Then a high quality Rb$_3$Ba$_3$Li$_2$Al$_4$B$_6$O$_{20}$F seed was dipped into the surface of the solution at 10° C. higher than the saturation temperature. This was followed by decreasing the temperature to the saturation point over 40 min. From this temperature, the solution was cooled at a rate of 0.25° C. per day. After the desired crystal size was obtained, the Rb$_3$Ba$_3$Li$_2$Al$_4$B$_6$O$_{20}$F crystal was pulled out of the solution and cooled to room temperature at a rate of 10° C./h.

Structural characterization: Single X-ray diffraction data with 3061 frames at 6 cm detector distance was collected on a Bruker SMART APEX2 diffractometer equipped with a 4K CCD area detector using graphite-monochromated Mo-K$\alpha$ radiation ($\lambda$=0.71073 Å). Data were integrated using the Bruker SAINT program. Absorption corrections based on the multiscan technique were applied. The structure was solved by direct methods using SHELXS-97. All atoms were refined using full matrix least-squares techniques, final least-squares refinement is on $F_o^2$ with data having $F_o^2 \geq 2\alpha$ ($F_o^2$). The structure was checked with PLATON and no higher symmetry was found.

Infrared Spectroscopy. The Fourier transform infrared spectroscopy (FTIR) spectra in the 400-4000 cm$^{-1}$ range were recorded on a Bruker Tensor 37 FTIR (see FIG. 12).

Thermal analysis: The thermal property of Rb$_3$Ba$_3$Li$_2$Al$_4$B$_6$O$_{20}$F was measured on EXSTAR TG/DTA 6300 instrument under flowing nitrogen gas, heated from room temperature to 1100° C. at a rate of 10° C. min$^{-1}$ in a platinum crucible (see FIG. 9A).

(Vacuum) UV-vis-NIR diffuse reflectance spectra: The UV-vis-NIR diffuse reflectance spectrum was measured at room temperature with a Cary 5000 UV-vis-NIR spectrophotometer in the 200-2500 nm wavelength range (see FIG. 11C).

SHG Measurement. Powder SHG were measured by using the Kurtz-Perry method with Q-switched Nd:YAG lasers at the wavelength of 1064 nm and 532 nm.[33] Polycrystalline samples of Rb$_3$Ba$_3$Li$_2$Al$_4$B$_6$O$_{20}$F and KH$_2$PO$_4$ (KDP) were ground and sieved into distinct particle size ranges (<20, 20-45, 45-63, 63-75, 75-90, 90-125, >125 μm). Sieved KDP powder was used as a reference. The intensity of the frequency-doubled output emitted from the sample was measured using a photomultiplier tube.

Refractive Index Measurements: A (100) wafer of Rb$_3$Ba$_3$Li$_2$Al$_4$B$_6$O$_{20}$F with size of 7×6×1 mm$^3$ was polished using a Unipol-300 grinding/polishing machine (MTI Co.) for the refractive index measurements. The measurements were carried out using a Metricon Model 2010/M prism coupler (Metricon Co.) at 450.2, 532, 636.5, 829.3, and 1062.6 nm.

Laser Damage Threshold Measurement. The measurement was carried out on an Nd:YAG nanosecond laser (Model: Minilite II, Continuum Eletro-Optics, Inc.) at a wavelength of 1064 nm. The laser pulse duration was set at 6 ns, and the frequency was fixed at 15 Hz. The laser beam was focused with a convex lens, resulting in a beam diameter of 0.36 mm.

Figure 8:
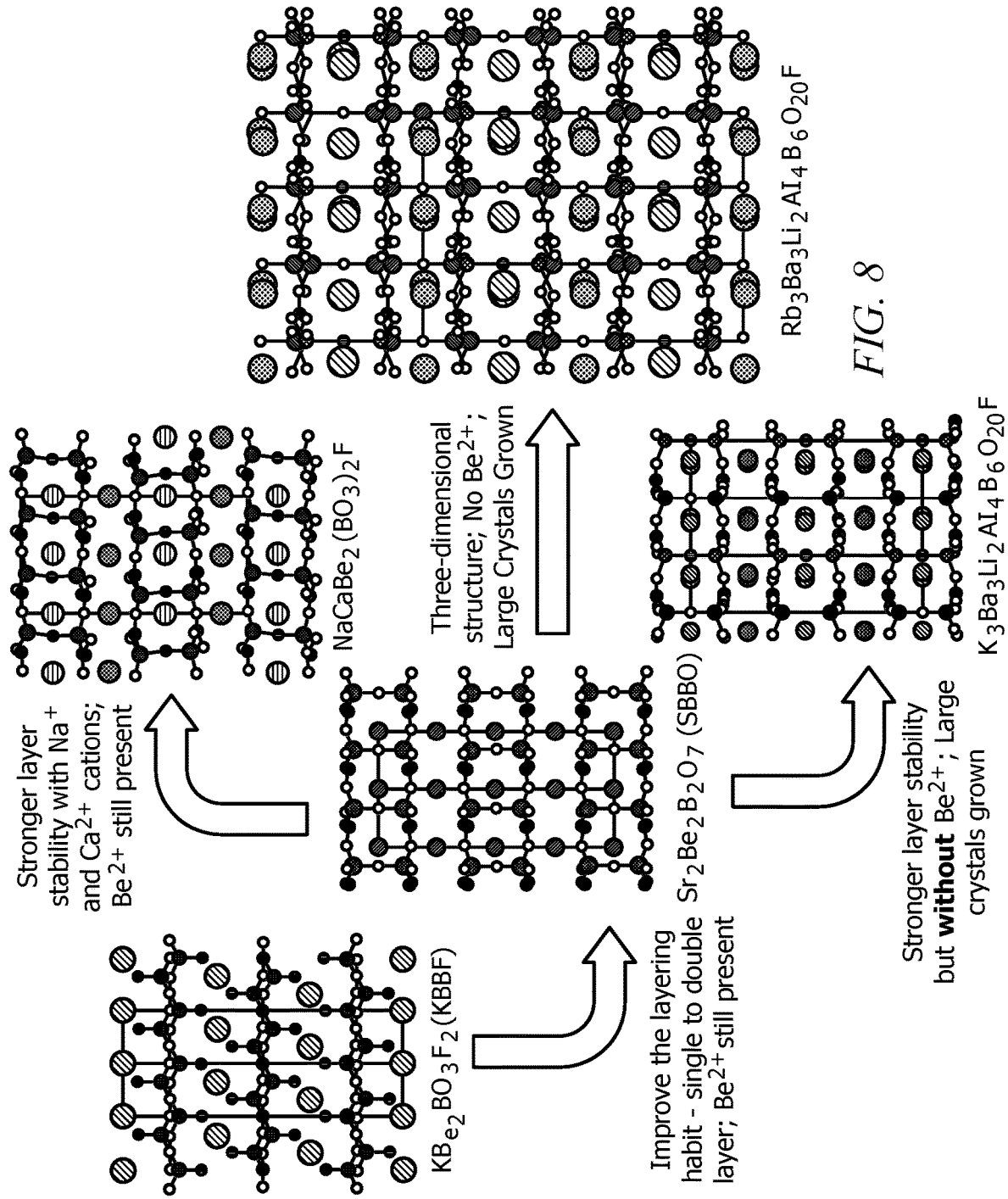
FIG. 8 is a schematic illustration of the structural evolution from KBBF to Rb$_3$Ba$_3$Li$_2$Al$_4$B$_6$O$_{20}$F.

FIG. 8 is a schematic illustration of the structural evolution from KBBF to Rb$_3$Ba$_3$Li$_2$Al$_4$B$_6$O$_{20}$F. The structural evolution from KBBF to Rb$_3$Ba$_3$Li$_2$Al$_4$B$_6$O$_{20}$F may occur because the single-layer structure of KBBF makes it exhibit a strong layer habit. In order to improve the layer habit, the SBBO family, including SBBO, NaCaBe$_2$(BO$_3$)$_2$F, and K$_3$Sr$_3$Li$_2$Al$_4$B$_6$O$_{20}$F, were fabricated. Although the fabricated materials improved the structural stability of KBBF, the double layers are separated by alkaline-earths, leading to the structural instability. In order to thoroughly resolve the layer habit and structural instability issue, the 3D Rb$_3$Ba$_3$Li$_2$Al$_4$B$_6$O$_{20}$F was fabricated as discussed herein.

Figure 9A:
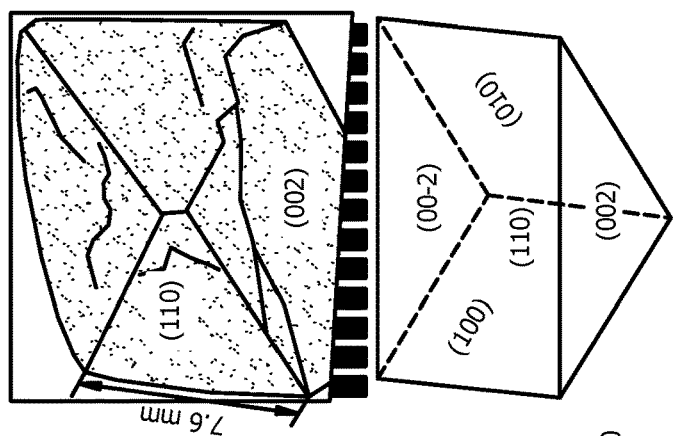
FIGS. 9A-9C illustrate a thermogravimetric/differential thermal analysis (TG/DTA) curve, a recrystallization curve, and a photo of a crystal of Rb$_3$Ba$_3$Li$_2$Al$_4$B$_6$O$_{20}$F fabricated according to aspects of the present disclosure.
Figure 9B:
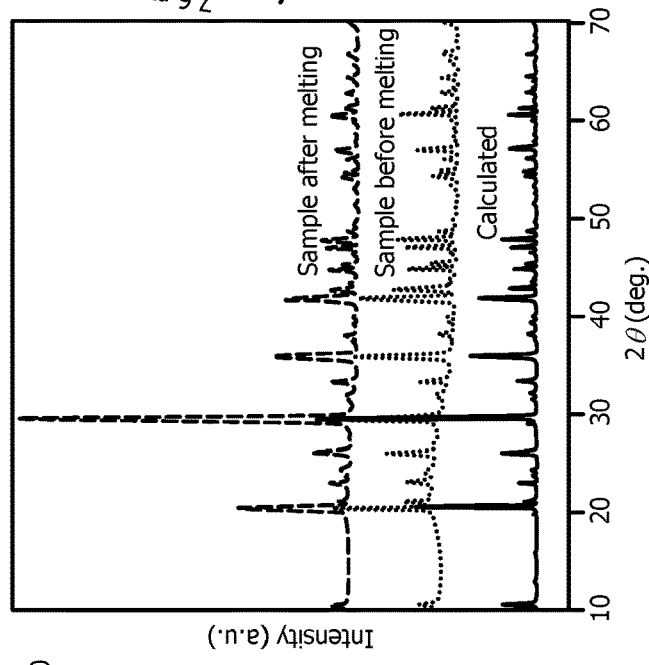
Figure 9C:
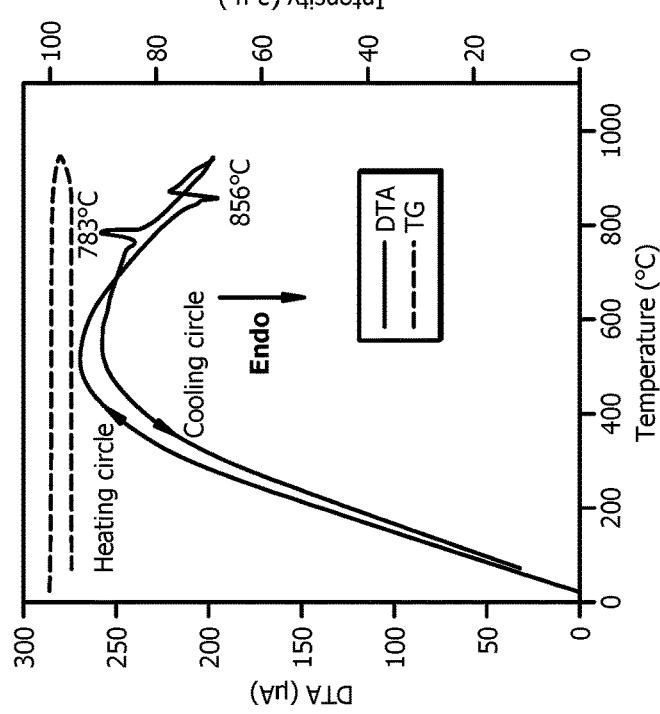

FIGS. 9A-9C illustrate a TG/DTA curve (FIG. 9A), a recrystallization curve (FIG. 9B), and a photo (FIG. 9C) for NLO materials fabricated according to aspects of the present disclosure. Rb$_3$Ba$_3$ was synthesized and the phase-purity was confirmed by powder X-ray diffraction (PXRD) (FIG. 9A), and thermal analysis indicates that Rb$_3$Ba$_3$ melts congruently with one endothermic (exothermic) peak on heating (cooling) at 856° C. (783 C) (FIG. 9B). The congruent melting behavior is confirmed by the PXRD pattern of the recrystallized Rb$_3$Ba$_3$ melt above 900 C. A slight weight loss attributable to volatilization of RbF is observed in the thermal analysis. Thus, in order to reduce the crystallization temperature, a Li$_2$O—BaF$_2$—B$_2$O$_3$ flux was used for the crystal growth. Using the top-seeded solution growth method a large single crystal (12×8×7.6 mm$^3$) of $Rb_3Ba_3Li_2Al_4B_6O_{20}F$ was grown and indexed (FIG. 9C). The crystal has a 7.6 mm thickness along the optical axis, c-axis (FIG. 9C).

FIGS. 10A-10D are schematics of the building blocks and as-fabricated structure of $Rb_3Ba_3Li_2Al_4B_6O_{20}F$, fabricated according to certain aspects of the present disclosure.

Figures 10A, 10B, 10C, 10D:
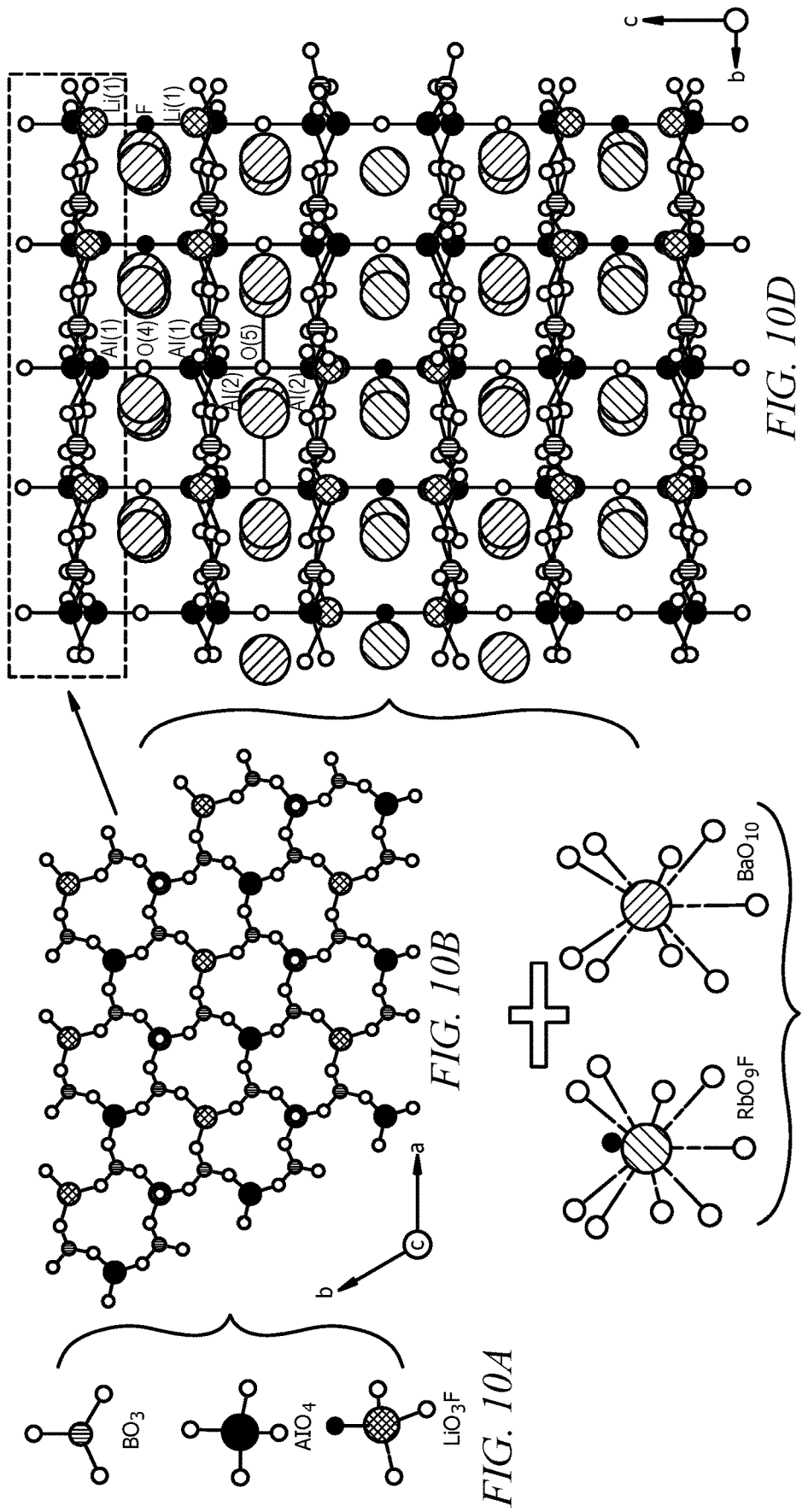
FIGS. 10A-10D are schematics of the building blocks and as-fabricated structure of $Rb_3Ba_3Li_2Al_4B_6O_{20}F$, fabricated according to certain aspects of the present disclosure.

The structure of $Rb_3Ba_3Li_2Al_4B_6O_{20}F$ is illustrated broken out into FIG. 10A, the basic building units of $Rb_3Ba_3Li_2Al_4B_6O_{20}F$ are $BO_3$ triangles, $AlO_4$ trahedra, and $LiO_3F$ tetrahedral; FIG. 10B, illustrating the building units connect with each other to form $[LiAl_2B_3O_{11}F]_\infty$ layer; FIG. 10C, illustrating the $RbO_9F$ and $BaO_{10}$ structures; and FIG. 10D, illustrating that these layers stack along the c axis and connected by Al—O—Al bonding to form 3D framework and Rb and Ba cations filled in the space. $Rb_3Ba_3$ is built up from BO3 triangles, $AlO_4$ and $LiO_3F$ tetrahedra, illustrated in FIG. 10A. In the ab-plane, the $BO_3$ triangles are co-planar and are linked through oxygen to $LiO_3F$ and $AlO_4$ tetrahedra to form a $[LiAl_2B_3O_{11}F]_\infty$ single layer. Additionally, the $[LiAl_2B_3O_{11}F]_\infty$ single layer are bridged by Al(1)—O(4) and Li(1)—F(1) bonds to form a $[Li_2Al_4B_6O_{20}F]_\infty$ double layer. These $[Li_2Al_4B_6O_{2i}F]_\infty$ double layers stack along c-axis and are connected by the Al(2)—O(5) bonds to form a three-dimensional (3D) anion framework (FIG. 10D). In connectivity terms the structure may be written as $[2(LiO_{3/2}F_{1/2})^{2.5-} 6(BO_{3/2})^0 4(AlO_{4/2})^-]^{9-}$ with charge balance retained by the three Rb+ and three Ba2+ cations. The bond lengths are consistent with previously reported compounds and oxidation states respectively (See Table 8 below).

The structure of $Rb_3Ba_3Li_2Al_4B_6O_{20}F$ was determined by single X-ray diffraction and is illustrated in Table 6 below.

TABLE 6

Crystal data and structure refinement for $Rb_3Ba_3Li_2Al_4B_6O_{20}F$.

| | |
|---|---|
| Empirical formula | $Rb_3Ba_3Li_2Al_4B_6O_{20}F$ |
| Wavelength | 0.71073 |
| Formula weight | 786.41 |
| Crystal system | Hexagonal |
| Space group | P-62c |
| Unit cell dimensions | a = 8.7017 (2) Å |
| Z | 2 |
| Volume (Å$^3$) | 1113.51 (6) |
| Calculated density (Mg/m$^3$) | 3.561 |
| Absorption coefficient (/mm) | 12.018 |
| Reflections collected/unique | 6541/888 |
| | [R(int) = 0.0254] |
| Completeness to theta (27.47°) | 100.0% |
| Goodness-of-fit on F$^2$ | 1.080 |
| Final R indices | R1 = 0.0148, |
| [I > 2sigma(I)][a] | wR2 = 0.0368 |
| Flack factor | 0.031 (16) |
| Extinction coefficient | 0.00022 (7) |
| Largest diff. peak and hole | 0.916 and −0.660 |

[a]$R_1 = \Sigma ||F_o| - |F_c||/\Sigma|F_o|$ and $wR_2 = [\Sigma w(F_o^2 - F_c^2)^2/\Sigma w F_o^4]^{1/2}$ for $F_o^2 > 2\sigma(F_o^2)$ Table 7 lists atomic coordinates ($\times 10^4$) and equivalent isotropic displacement parameters (Å$^2 \times 10^3$) for $Rb_3Ba_3Li_2Al_4B_6O_{20}F$. $U_{eq}$ is defined as one-third of the trace of the orthogonalized $U_{ij}$ tensor.

TABLE 7

| Atom | X | Y | Z | $U_{eq}$ | BVS |
|---|---|---|---|---|---|
| Ba (1) | 6285 (1) | 6285 (1) | 0 | 13 (1) | 1.88 |
| Rb (1) | 6998 (1) | 6600 (1) | 2500 | 20 (1) | 1.02 |
| Li (1) | 6667 | 3333 | 1347 (6) | 12 (2) | 0.97 |

TABLE 7-continued

| Atom | X | Y | Z | $U_{eq}$ | BVS |
|---|---|---|---|---|---|
| Al (1) | 3333 | 6667 | 1509 (1) | 12 (1) | 3.27 |
| Al (2) | 10000 | 10000 | 1002 (1) | 13 (1) | 3.14 |
| B (1) | 6719 (5) | 9916 (5) | 1119 (3) | 11 (1) | 3.03 |
| O (1) | 4921 (4) | 8698 (4) | 1120 (2) | 29 (1) | 2.15 |
| O (2) | 7830 (4) | 9275 (3) | 1328 (2) | 25 (1) | 2.05 |
| O (3) | 7268 (3) | 11598 (4) | 918 (1) | 21 (1) | 1.88 |
| O (4) | 3333 | 6667 | 2500 | 47 (2) | 2.06 |
| O (5) | 10000 | 10000 | 0 | 45 (2) | 1.98 |
| F (1) | 6667 | 3333 | 2500 | 20 (1) | 1.08 |

As shown in at least FIG. 10D, structure of $Rb_3Ba_3Li_2Al_4B_6O_{20}F$ exhibits three structural features: 1) All of the B atoms are coordinated in the $BO_3$ triangles and these $BO_3$ triangles adopt a coplanar arrangement; 2) The terminal O atoms of $BO_3$ triangles are bonded by the $AlO_4/LiO_3F$ tetrahedra; 3) the $[LiAl_2B_3O_{11}F]_\infty$ layers stacking along c axis are connected by Al—O covalent bonds to form three-dimensional (3D) framework. Clearly, the first two structural features of $Rb_3Ba_3Li_2Al_4B_6O_{20}F$ are similar with KBBF and SBBO, which will favor $Rb_3Ba_3Li_2Al_4B_6O_{20}F$ to exhibit the excellent NLO properties like KBBF and SBBO. However notably, the third structural feature of $Rb_3Ba_3Li_2Al_4B_6O_{20}F$ obviously distinguishes from KBBF and SBBO. As shown in FIG. 10D, KBBF contains the $[Be_2BO_3F_2]_\infty$ single layers and the $[Be_2BO_3F_2]_\infty$ single layers are connected by the weak K—F ion bonds, which lead to the strong layer habit. In SBBO series, SBBO, $NaCaBe_2(BO_3)_2F$ and $K_3Ba_3Li_2Al_4B_6O_{20}F$ all have the double-layer structure. Although the double-layer structure improves the layer habit of KBBF, the double layers are separated alkaline-earth cations, $Ca^{2+}$, $Sr^{2+}$, or $Ba^{2+}$, which will lead the structural instability or the anisotropic crystal growth. However in the structure of $Rb_3Ba_3Li_2Al_4B_6O_{20}F$, all the $[LiAl_2B_3O_{11}F]_\infty$ layers are connected by the Al—O covalent bonds to form 3D framework. The 3D framework structure will completely resolve the layer habit and structural instability problem in KBBF and SBBO, which has been confirmed by the fact that high quality of bulk $Rb_3Ba_3Li_2Al_4B_6O_{20}F$ without layer habit can be grown by the TSSG method. In addition, in $Rb_3Ba_3Li_2Al_4B_6O_{20}F$, $Be^{2+}$ cations, similar with $K_3Ba_3Li_2Al_4B_6O_{20}F$, are substituted by the $Li^+/Al^{3+}$ cations. This substitution also makes $Rb_3Ba_3Li_2Al_4B_6O_{20}F$ Be-free. Therefore, in this sense, $Rb_3Ba_3Li_2Al_4B_6O_{20}F$ would overcome all the crystal growth issues in KBBF and SBBO and represents new generation of deep-UV NLO material.

Figure 11A:
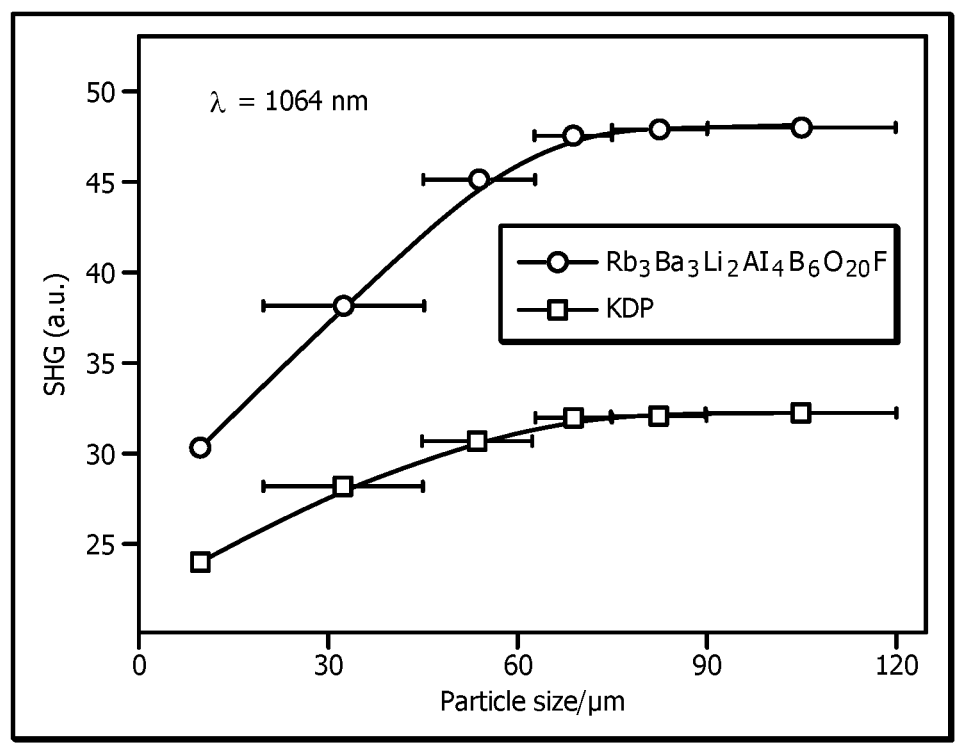
FIGS. 11A-11D illustrate linear and non-linear optical properties of $Rb_3Ba_3Li_2Al_4B_6O_{20}F$ fabricated according to certain aspects of the present disclosure.
Figure 11B:
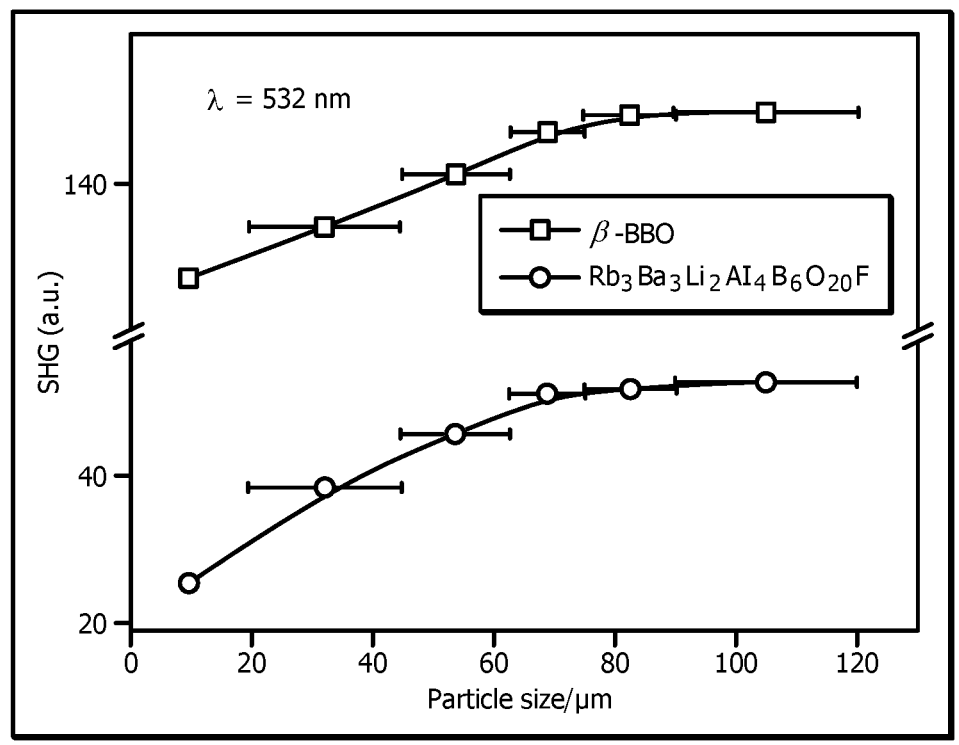

FIGS. 11A-11D illustrate linear and non-linear optical properties of $Rb_3Ba_3Li_2Al_4B_6O_{20}F$ fabricated according to certain aspects of the present disclosure. In particular, powder second harmonic generation measurements are illustrated in FIG. 11A at 1064 nm and in FIG. 11B at 532 nm reveal that $Rb_3Ba_3Li_2Al_4B_6O_{20}F$ is type-1 phase-matchable. The powder SHG measurements of $Rb_3Ba_3Li_2Al_4B_6O_{20}F$ with incident radiations at 1064 nm (FIG. 11A) and 532 nm (FIG. 11B) were also performed, respectively. The measurements indicate that $Rb_3Ba_3Li_2Al_4B_6O_{20}F$ has SHG efficiencies of approximately 1.5×KDP and 0.3×β-BBO at 532 nm and 266 nm, respectively, and it can be phase-matchable at both wavelengths. Clearly, the relative large SHG response will favor its application as the deep-UV NLO material.

Figure 11C:
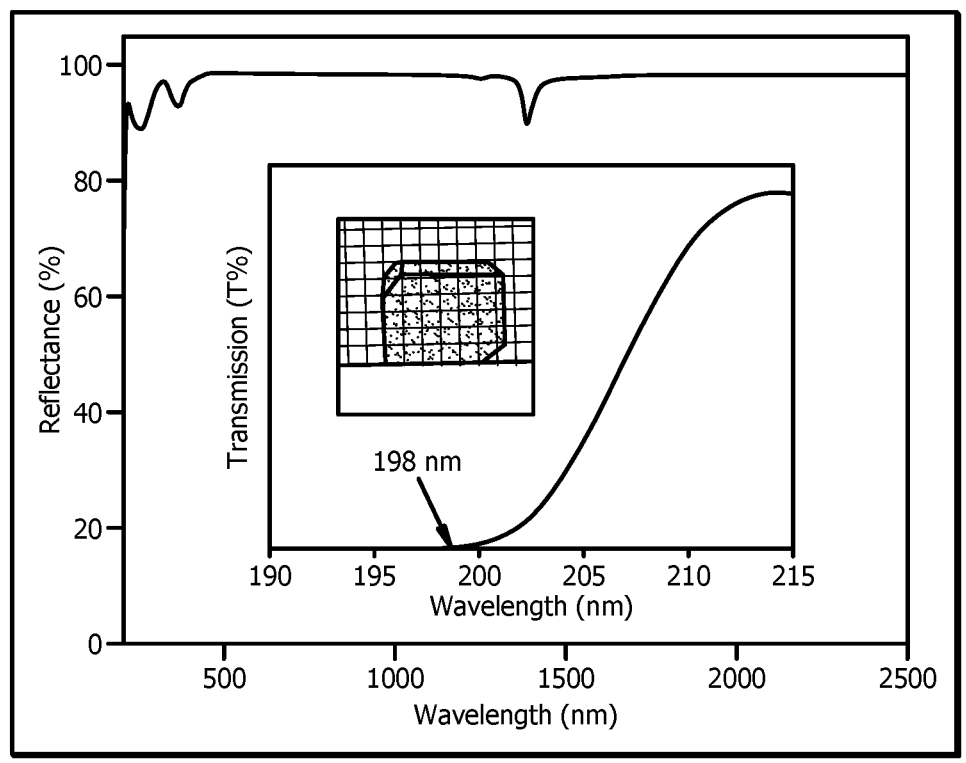
Figure 11D:
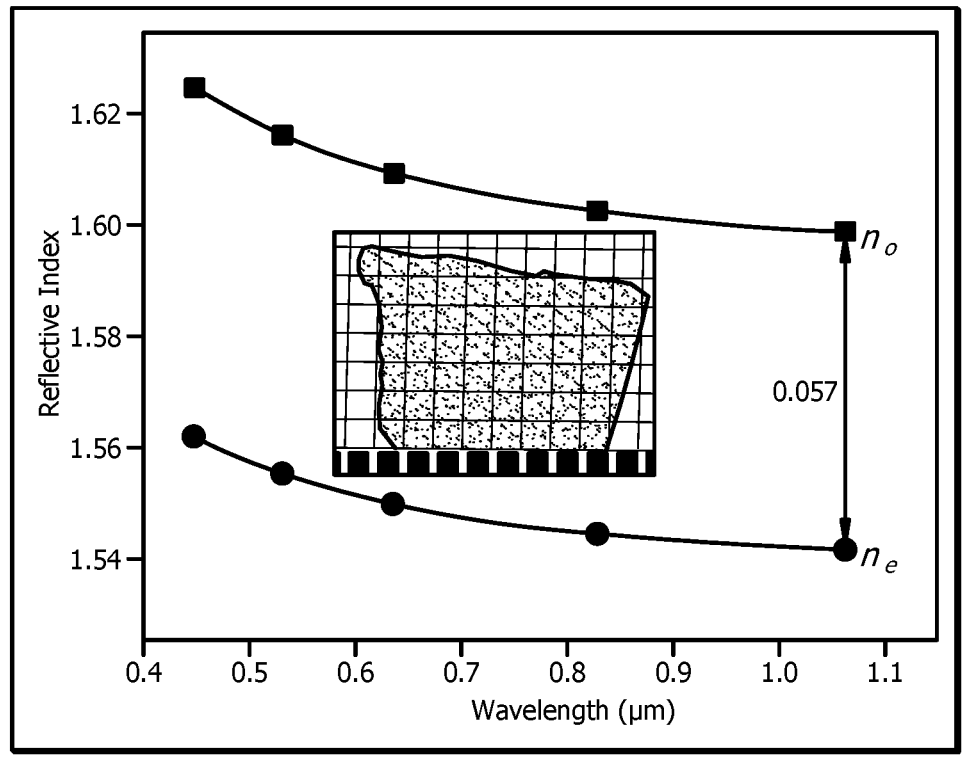

FIG. 11C is a graph of the reflectance % v. wavelength, and the transmission spectrum indicates the absorption edge of $Rb_3Ba_3Li_2Al_4B_6O_{20}F$ is at 198 nm. FIG. 11D is a graph of the refractive index measurement that illustrates $Rb_3Ba_3Li_2Al_4B_6O_{20}F$ has a moderate birefrigence, 0.057 at 1064 nm. The UV-vis-NIR diffusion reflection spectrum of $Rb_3Ba_3Li_2Al_4B_6O_{20}F$ in the 200-2500 nm wavelength range was shown in FIG. 11C. It is clear that $Rb_3Ba_3Li_2Al_4B_6O_{20}F$ has a wide transmission region and the reflectance is higher than 90% from 210 nm to 2500 nm, with a short UV cut-off edge below 200 nm as determined from the UV-vis-IR diffuse-reflectance spectrum (FIG. 11C)). The wide transmission range is comparable with other UV NLO materials, indicating that this material is commercially viable.

Further, the refractive index of $Rb_3Ba_3Li_2Al_4B_6O_{20}F$ is also measured by the prism coupling method. The measured $n_o$ and $n_e$ at different wavelengths—450.2, 532, 636.5, 829.3, and 1062.6 nm are listed in Table 8.

TABLE 8

| Selected bond distances (Å) and angles (deg) for $Rb_3Ba_3Li_2Al_4B_6O_{20}F$ | | | |
|---|---|---|---|
| Ba(1)-O(3)#1 | 2.664 (2) | O(1)#3-Ba(1)-O(5) | 127.07 (6) |
| Ba(1)-O(3)#2 | 2.664 (2) | O(1)#4-Ba(1)-O(5) | 127.07 (6) |
| Ba(1)-O(1)#3 | 2.681 (2) | O(3)#3-Ba(1)-O(5) | 140.58 (5) |
| Ba(1)-O(1)#4 | 2.681 (2) | O(3)#4-Ba(1)-O(5) | 140.58 (5) |
| Ba(1)-O(3)#3 | 3.102 (2) | O(2)-Ba(1)-O(5) | 51.76 (5) |
| Ba(1)-O(3)#4 | 3.102 (2) | O(2)#5-Ba(1)-O(5) | 51.76 (5) |
| Ba(1)-O(2) | 3.188 (3) | F(1)-Rb(1)-O(2)#7 | 134.66 (6) |
| Ba(1)-O(2)#5 | 3.188 (3) | F(1)-Rb(1)-O(2) | 134.66 (6) |
| Ba(1)-O(5) | 3.2323 (3) | O(2)#7-Rb(1)-O(2) | 87.94 (11) |
| Rb(1)-F(1) | 2.7103 (5) | F(1)-Rb(1)-O(3)#8 | 65.84 (5) |
| Rb(1)-O(2)#7 | 2.867 (2) | O(2)#7-Rb(1)-O(3)#8 | 69.58 (8) |
| Rb(1)-O(2) | 2.867 (2) | O(2)-Rb(1)-O(3)#8 | 144.13 (8) |
| Rb(1)-O(3)#8 | 3.218 (2) | F(1)-Rb(1)-O(3)#1 | 65.84 (5) |
| Rb(1)-O(3)#1 | 3.218 (2) | O(2)#7-Rb(1)-O(3)#1 | 144.13 (8) |
| Rb(1)-O(4) | 3.2180 (5) | O(2)-Rb(1)-O(3)#1 | 69.58 (8) |
| Rb(1)-O(1)#4 | 3.375 (3) | O(3)#8-Rb(1)-O(3)#1 | 113.19 (8) |
| Rb(1)-O(1)#10 | 3.375 (3) | F(1)-Rb(1)-O(4) | 115.604 (17) |
| Rb(1)-O(2)#8 | 3.443 (3) | O(2)#7-Rb(1)-O(4) | 80.55 (6) |
| Rb(1)-O(2)#1 | 3.443 (3) | O(2)-Rb(1)-O(4) | 80.55 (6) |
| Li(1)-F(1) | 1.957 (11) | O(3)#8-Rb(1)-O(4) | 120.59 (4) |
| Li(1)-O(3)#1 | 1.969 (5) | O(3)#1-Rb(1)-O(4) | 120.59 (4) |
| Li(1)-O(3)#11 | 1.969 (5) | F(1)-Rb(1)-O(1)#4 | 87.51 (5) |
| Li(1)-O(3)#4 | 1.969 (5) | O(2)#7-Rb(1)-O(1)#4 | 128.60 (7) |
| Al(1)-O(4) | 1.683 (2) | O(2)-Rb(1)-O(1)#4 | 70.09 (7) |
| Al(1)-O(1)#14 | 1.740 (3) | O(3)#8-Rb(1)-O(1)#4 | 145.73 (8) |
| Al(1)-O(1) | 1.740 (3) | O(3)#1-Rb(1)-O(1)#4 | 70.54 (7) |
| Al(1)-O(1)#4 | 1.740 (3) | O(4)-Rb(1)-O(1)#4 | 51.03 (5) |
| Al(2)-O(5) | 1.701 (2) | Li(1)-Rb(1)-O(1)#4 | 63.78 (10) |
| Al(2)-O(2) | 1.754 (3) | Li(1)#9-Rb(1)-O(1)#4 | 111.81 (10) |
| Al(2)-O(2)#15 | 1.754 (3) | F(1)-Rb(1)-O(1)#10 | 87.51 (5) |
| Al(2)-O(2)#1 | 1.754 (3) | O(2)#7-Rb(1)-O(1)#10 | 70.09 (7) |
| B(1)-O(3) | 1.337 (5) | O(2)-Rb(1)-O(1)#10 | 128.60 (7) |
| B(1)-O(2) | 1.382 (5) | O(3)#8-Rb(1)-O(1)#10 | 70.54 (7) |
| B(1)-O(1) | 1.383 (5) | O(3)#1-Rb(1)-O(1)#10 | 145.73 (8) |
| O(1)-Ba(1)#14 | 2.681 (2) | O(4)-Rb(1)-O(1)#10 | 51.03 (5) |
| O(1)-Rb(1)#14 | 3.375 (3) | Li(1)-Rb(1)-O(1)#10 | 111.81 (10) |
| O(2)-Rb(1)#16 | 3.443 (3) | Li(1)#9-Rb(1)-O(1)#10 | 63.78 (10) |
| O(3)-Li(1)#17 | 1.969 (5) | O(1)#4-Rb(1)-O(1)#10 | 87.97 (8) |
| O(3)-Ba(1)#15 | 2.664 (2) | F(1)-Rb(1)-O(2)#8 | 95.63 (5) |
| O(3)-Ba(1)#14 | 3.102 (2) | O(2)#7-Rb(1)-O(2)#8 | 53.44 (11) |
| O(3)-Rb(1)#16 | 3.218 (2) | O(2)-Rb(1)-O(2)#8 | 101.95 (9) |
| O(4)-Al(1)#10 | 1.683 (2) | O(3)#8-Rb(1)-O(2)#8 | 42.21 (7) |
| O(4)-Rb(1)#14 | 3.2180 (5) | O(3)#1-Rb(1)-O(2)#8 | 102.97 (6) |
| O(4)-Rb(1)#10 | 3.2180 (5) | O(4)-Rb(1)-O(2)#8 | 133.48 (5) |
| O(5)-Al(2)#2 | 1.701 (2) | Li(1)-Rb(1)-O(2)#8 | 114.70 (9) |
| O(5)-Ba(1)#15 | 3.2323 (3) | Li(1)#9-Rb(1)-O(2)#8 | 74.99 (9) |
| O(5)-Ba(1)#1 | 3.2323 (3) | O(1)#4-Rb(1)-O(2)#8 | 170.93 (6) |
| F(1)-Li(1)#9 | 1.957 (11) | O(1)#10-Rb(1)-O(2)#8 | 100.64 (5) |
| F(1)-Rb(1)#12 | 2.7103 (5) | F(1)-Rb(1)-O(2)#1 | 95.63 (5) |
| F(1)-Rb(1)#9 | 2.7104 (5) | O(2)#7-Rb(1)-O(2)#1 | 101.95 (9) |
| O(3)#1-Ba(1)-O(3)#2 | 151.62 (12) | O(2)-Rb(1)-O(2)#1 | 53.44 (11) |
| O(3)#1-Ba(1)-O(1)#3 | 106.25 (8) | O(3)#8-Rb(1)-O(2)#1 | 102.97 (6) |
| O(3)#2-Ba(1)-O(1)#3 | 90.90 (9) | O(3)#1-Rb(1)-O(2)#1 | 42.21 (7) |
| O(3)#1-Ba(1)-O(1)#4 | 90.90 (9) | O(4)-Rb(1)-O(2)#1 | 133.48 (5) |
| O(3)#2-Ba(1)-O(1)#4 | 106.25 (8) | Li(1)-Rb(1)-O(2)#1 | 74.99 (9) |
| O(1)#3-Ba(1)-O(1)#4 | 105.86 (13) | Li(1)#9-Rb(1)-O(2)#1 | 114.70 (9) |
| O(3)#1-Ba(1)-O(3)#3 | 141.58 (2) | O(1)#4-Rb(1)-O(2)#1 | 100.64 (5) |
| O(3)#2-Ba(1)-O(3)#3 | 66.13 (11) | O(1)#10-Rb(1)-O(2)#1 | 170.93 (6) |
| O(1)#3-Ba(1)-O(3)#3 | 47.16 (8) | O(2)#8-Rb(1)-O(2)#1 | 70.63 (8) |
| O(1)#4-Ba(1)-O(3)#3 | 75.44 (7) | F(1)-Li(1)-O(3)#1 | 111.7 (3) |
| O(3)#1-Ba(1)-O(3)#4 | 66.13 (11) | F(1)-Li(1)-O(3)#11 | 111.7 (3) |
| O(3)#2-Ba(1)-O(3)#4 | 141.58 (2) | O(3)#1-Li(1)-O(3)#11 | 107.1 (3) |
| O(1)#3-Ba(1)-O(3)#4 | 75.44 (7) | F(1)-Li(1)-O(3)#4 | 111.7 (3) |
| O(1)#4-Ba(1)-O(3)#4 | 47.16 (8) | O(3)#1-Li(1)-O(3)#4 | 107.1 (3) |
| O(3)#3-Ba(1)-O(3)#4 | 78.83 (10) | O(3)#11-Li(1)-O(3)#4 | 107.1 (3) |
| O(3)#1-Ba(1)-O(2) | 72.44 (7) | O(4)-Al(1)-O(1)#14 | 112.32 (11) |
| O(3)#2-Ba(1)-O(2) | 89.89 (7) | O(4)-Al(1)-O(1) | 112.32 (11) |
| O(1)#3-Ba(1)-O(2) | 178.32 (9) | O(1)#14-Al(1)-O(1) | 106.48 (12) |

TABLE 8-continued

Selected bond distances (Å) and angles (deg) for $Rb_3Ba_3Li_2Al_4B_6O_{20}F$

| | | | |
|---|---|---|---|
| O(1)#4-Ba(1)-O(2) | 75.32 (8) | O(4)-Al(1)-O(1)#4 | 112.32 (11) |
| O(3)#3-Ba(1)-O(2) | 134.51 (7) | O(1)#14-Al(1)-O(1)#4 | 106.48 (12) |
| O(3)#4-Ba(1)-O(2) | 104.79 (6) | O(1)-Al(1)-O(1)#4 | 106.48 (12) |
| O(3)#1-Ba(1)-O(2)#5 | 89.89 (7) | O(5)-Al(2)-O(2) | 108.39 (11) |
| O(3)#2-Ba(1)-O(2)#5 | 72.44 (7) | O(5)-Al(2)-O(2)#15 | 108.39 (11) |
| O(1)#3-Ba(1)-O(2)#5 | 75.32 (8) | O(2)-Al(2)-O(2)#15 | 110.54 (10) |
| O(1)#4-Ba(1)-O(2)#5 | 178.32 (9) | O(5)-Al(2)-O(2)#1 | 108.39 (11) |
| O(3)#3-Ba(1)-O(2)#5 | 104.79 (6) | O(2)-Al(2)-O(2)#1 | 110.54 (10) |
| O(3)#4-Ba(1)-O(2)#5 | 134.51 (7) | O(2)#15-Al(2)-O(2)#1 | 110.53 (10) |
| O(2)-Ba(1)-O(2)#5 | 103.52 (10) | O(3)-B(1)-O(2) | 124.6 (3) |
| O(3)#1-Ba(1)-O(5) | 75.81 (6) | O(3)-B(1)-O(1) | 119.2 (3) |
| O(3)#2-Ba(1)-O(5) | 75.81 (6) | O(2)-B(1)-O(1) | 116.2 (3) |

Symmetry transformations used to generate equivalent atoms for Table 3: #1 −y+2,x−y+1,z #2 x−y+1,−y+2,−z #3 −x+1,−x+y,−z #4 −x+y,−x+1,z #5 y,x,−z, #6 x−y,−y+1,−z #7 x,y,−z+½ #8 −y+2,x−y+1,−z+½ #9 −x+y+1,−x+1,−z+½ #10 −x+y,−x+1,−z+½ #11 x,y−1,z #12 −y+1,x−y,z #13 −x+y+1,−x+1,z+½ #14 −y+1,x−y+1,z #15 −x+y+1,−x+2,z #16 −x+y+1,−x+2,−z+½ #17 x,y+1,z.

Based on the measurement, the following Sellmeier equations for $Rb_3Ba_3Li_2Al_4B_6O_{20}F$, i.e. the refractive indices, $n_o(\lambda)$ and $n_e(\lambda)$ as a function of wavelength $\lambda$ were fitted by the least-squares method.

$$n_o^2 = 2.54181 + \frac{0.02028}{\lambda^2 + 0.00285} - 0.00366\lambda^2$$

$$n_e^2 = 2.36263 + \frac{0.01569}{\lambda^2 + 0.000559} + 0.0000132\lambda^2$$

The experimental and calculated refractive indices are in agreement, as shown in FIG. 11D. And for $Rb_3Ba_3Li_2Al_4B_6O_{20}F$, it is clear that a moderate birefringence is observed (~0.057 at 1064 nm). The suitable birefringence suggests that $Rb_3Ba_3Li_2Al_4B_6O_{20}F$ is a promising deep-UV NLO material.

Figure 15A:
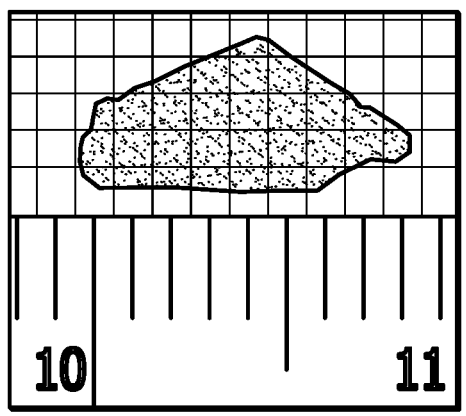
FIGS. 15A and 15B are before (15A) and after (15B) images of a high quality $Rb_3Ba_3Li_2Al_4B_6O_{20}F$ crystal fabricated according to certain aspects of the present disclosure that was placed in water for a week with no decomposition or degradation observed.
Figure 15B:
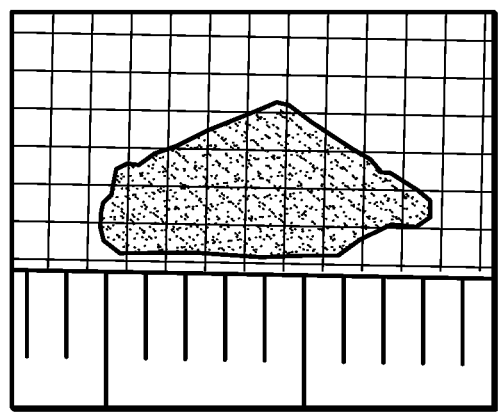

In addition, the laser damage threshold measurement at 1064 nm with 6 ns pulse width shows $Rb_3Ba_3Li_2Al_4B_6O_{20}F$ has a damage threshold larger than 1 GW/cm², which is comparable with commercialized NLO crystals. FIGS. 15A and 15B are before (15A) and after (15B) images of a high quality $Rb_3Ba_3Li_2Al_4B_6O_{20}F$ crystal that was placed in water for a week with no decomposition or degradation observed. These properties of $Rb_3Ba_3Li_2Al_4B_6O_{20}F$ also satisfy the requirements of deep-UV NLO materials.

In conclusion, based on crystal structural engineering design, a new deep-UV NLO material $Rb_3Ba_3Li_2Al_4B_6O_{20}F$ has been successfully designed and synthesized. This compound retains the structural priority of KBBF and SBBO, but the structure features a 3D framework, which make $Rb_3Ba_3Li_2Al_4B_6O_{20}F$ thoroughly resolve the layer habit and structural instability issues in KBBF and SBBO. Meanwhile, $Rb_3Ba_3Li_2Al_4B_6O_{20}F$ exhibits excellent NLO properties, including relatively large SHG response, ~1.5×KDP and 0.3×β-BBO at 532 nm and 266 nm, respectively, the short UV cut-off edge, and the suitable birefringence may be about at least 0.06. In addition, this compound melts congruently and high quality of single crystal with size of 12×8×7.6 mm³ was grown.

Table 9 illustrates wavelengths and refractive indexes for $Rb_3Ba_3Li_2Al_4B_6O_{20}F$ fabricated according to certain aspects of the present disclosure.

TABLE 9

Measured and calculated values for $Rb_3Ba_3Li_2Al_4B_6O_{20}F$.

| Wavelength (nm) | $n_o$ | | $n_e$ | | $\Delta n$ |
|---|---|---|---|---|---|
| | Measured | Fitted | Measured | Fitted | |
| 450.2 | 1.6247 | 1.6247 | 1.562 | 1.5620 | 0.0627 |
| 532 | 1.6162 | 1.6161 | 1.555 | 1.5550 | 0.0612 |
| 636.5 | 1.6092 | 1.6094 | 1.5496 | 1.5496 | 0.0596 |
| 829.3 | 1.6028 | 1.6027 | 1.5445 | 1.5445 | 0.0583 |
| 1062.6 | 1.5986 | 1.5986 | 1.5416 | 1.5416 | 0.0570 |

Additional Aspects

The following enumerated aspects are provided as non-limiting examples

A first aspect which is a device comprising a nonlinear optical (NLO) material according to the formula $XLi_2Al_4B_6O_{20}F$.

A second aspect which is the device of the first aspect, wherein X comprises potassium (K) and strontium (Sr).

A third aspect which is the device of the first aspect, wherein X comprises $K_3Sr_3$.

A fourth aspect which is the device of the first aspect, wherein X comprises rubidium (Rb) and barium (Ba).

A fifth aspect which is the device of the first aspect, wherein X comprises $Rb_3Ba_3$.

A sixth aspect which is the device of any of the first through fifth aspects, wherein the NLO exhibits a walkoff of from about 1 mrad to about 200 mrad.

A seventh aspect which is the device of any of the first through sixth aspects, wherein the NLO forms single crystals with a minimum diameter of from about 2 mm to about 20 mm in at least two directions.

An eighth aspect which is the device of any of the first through seventh aspects, wherein the NLO exhibits a second harmonic generation coefficient of greater than 0.39 pm/V.

A ninth aspect which is the device of any of the first through eighth aspects, wherein the NLO exhibits a band gap of greater than 6.2 eV.

A tenth aspect which is the device of any of the first through ninth aspects, wherein the NLO exhibits an adsorption edge of less than 200 nm.

An eleventh aspect which is the device of any of the first through tenth aspects, wherein the NLO exhibits a laser damage threshold of greater than 5.0 GW/cm².

A twelfth aspect which is the device of any of the first through eleventh aspects, wherein the NLO exhibits a birefringence at 1064 nm ranging from about 0.05 to about 0.09.

A thirteenth aspect which is a device comprising a nonlinear optical material (NLO) according to the formula $KSrCO_3F$, wherein the NLO comprises at least one single crystal.

A fourteenth aspect which is the device of the thirteenth aspect, wherein the NLO exhibits a walkoff of from about 1 mrad to about 200 mrad.

A fifteenth aspect which is the device of any of the thirteenth through fourteenth aspects, wherein the NLO forms single crystals with a minimum diameter of from about 2 mm to about 20 mm in at least two directions.

A sixteenth aspect which is the device of any of the thirteenth through fifteenth aspects, wherein the NLO exhibits a second harmonic generation coefficient of greater than 0.39 pm/V.

A seventeenth aspect which is the device of any of the thirteenth through sixteenth aspects, wherein the NLO exhibits a band gap of greater than 6.2 eV.

An eighteenth aspect which is the device of any of the thirteenth through seventeenth aspects, wherein the NLO exhibits an adsorption edge of less than 200 nm.

A nineteenth aspect which is the device of any of the thirteenth through eighteenth aspects, wherein the NLO exhibits a laser damage threshold of greater than 5.0 $GW/cm^2$.

A twentieth aspect which is the device of any of the thirteenth through nineteenth aspects, wherein the NLO exhibits a birefringence at 1064 nm ranging from about 0.05 to about 0.09.

A twenty-first aspect which is a nonlinear optical material selected from the group consisting of $KSrCO_3F$ $Rb_3Ba_3Li_2Al_4B_6O_{20}F$ and $K_3Sr_3Li_2Al_4B_6O_{20}F$.

A twenty-second aspect which is a device comprising the nonlinear optical material of the twenty-first aspect.

Exemplary aspects are disclosed and variations, combinations, and/or modifications of the aspect(s) and/or features of the aspect(s) made by a person having ordinary skill in the art are within the scope of the disclosure. Alternative aspects that result from combining, integrating, and/or omitting features of the aspect(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of" Accordingly, the scope of protection is not limited by the description set out above but is defined by the claims that follow, that scope including all equivalents of the subject matter of the claims.

While exemplary aspects of the invention have been shown and described, modifications thereof can be made by one skilled in the art without departing from the scope or teachings herein. The aspects described herein are exemplary only and are not limiting. Many variations and modifications of the compositions, systems, apparatus, and processes described herein are possible and are within the scope of the invention that is claimed and thus defined below. Accordingly, the scope of protection is not limited to the aspects described herein, but is only limited by the claims that follow, the scope of which shall include all equivalents of the subject matter of the claims. Unless expressly stated otherwise, the steps in a method claim may be performed in any order and with any suitable combination of materials and processing conditions.

What is claimed is:

1. A device comprising a nonlinear optical (NLO) material according to the formula $XLi_2Al_4B_6O_{20}F$.

2. The device of claim 1, wherein X comprises potassium (K) and strontium (Sr).

3. The device of claim 1, wherein X comprises $K_3Sr_3$.

4. The device of claim 1, wherein X comprises rubidium (Rb) and barium (Ba).

5. The device of claim 1, wherein X comprises $Rb_3Ba_3$.

6. The device of claim 1, wherein the NLO exhibits a walkoff of from about 200 mrad to about 1 mrad.

7. The device of claim 1, wherein the NLO forms single crystals with a minimum diameter of from about 2 mm to about 20 mm in at least two directions.

8. The device of claim 1, wherein the NLO exhibits a second harmonic generation coefficient of greater than 0.39 pm/V.

9. The device of claim 1, wherein the NLO exhibits a band gap of greater than 6.2 eV.

10. The device of claim 1, wherein the NLO exhibits an adsorption edge of less than 200 nm.

11. The device of claim 1, wherein the NLO exhibits a laser damage threshold of greater than 5.0 $GW/cm^2$.

12. The device of claim 1, wherein the NLO exhibits a birefringence at 1064 nm ranging from about 0.05 to about 0.09.

13. A nonlinear optical material selected from the group consisting of $Rb_3Ba_3Li_2Al_4B_6O_{20}F$ and $K_3Sr_3Li_2Al_4B_6O_{20}F$.

14. A device comprising the nonlinear optical material of claim 13.

* * * * *

UNITED STATES PATENT AND TRADEMARK OFFICE
CERTIFICATE OF CORRECTION

PATENT NO. : 11,262,640 B2
APPLICATION NO. : 16/492261
DATED : March 1, 2022
INVENTOR(S) : P. Shiv Halasyamani et al.

It is certified that error appears in the above-identified patent and that said Letters Patent is hereby corrected as shown below:

In the Specification

Please replace the Statement Regarding Federally Sponsored Research or Development as follows:
--STATEMENT REGARDING FEDERALLY SPONSORED RESEARCH OR DEVELOPMENT
This invention was made with government support under DMR1503573 awarded by the National Science Foundation. The government has certain rights in the invention.--

Signed and Sealed this
Twenty-sixth Day of March, 2024

Katherine Kelly Vidal
*Director of the United States Patent and Trademark Office*